United States Patent [19]

Nagasaka et al.

[11] Patent Number: 5,483,217

[45] Date of Patent: Jan. 9, 1996

[54] ELECTRONIC CIRCUIT DEVICE

[75] Inventors: Takashi Nagasaka, Anjo; Mitsuhiro Saitou, Obu; Takahisa Koyasu, Chita; Hiroyuki Ban, Hazu; Yuji Otani, Okazaki; Kengo Oka, Nukata; Kyoko Nagaoka, Matsumoto, all of Japan

[73] Assignee: Nippondenso Co., Ltd., Kariya, Japan

[21] Appl. No.: 91,718

[22] Filed: Jul. 15, 1993

[30] Foreign Application Priority Data

| Jul. 15, 1992 | [JP] | Japan | 4-188418 |
| Jul. 23, 1992 | [JP] | Japan | 4-196991 |
| Jul. 24, 1992 | [JP] | Japan | 4-198498 |
| Jul. 24, 1992 | [JP] | Japan | 4-198511 |

[51] Int. Cl.$^6$ ............................ H01C 1/02
[52] U.S. Cl. ................... 338/252; 338/260; 338/312
[58] Field of Search .................... 338/260, 250, 338/230, 243, 252, 308, 314, 312

[56] References Cited

U.S. PATENT DOCUMENTS

| 4,311,980 | 1/1982 | Prudenziati | 338/4 |
| 4,735,676 | 4/1988 | Iwasa | 338/308 X |
| 4,795,670 | 1/1989 | Nishigaki et al. | |
| 5,039,976 | 8/1991 | Drabkin | 338/314 |
| 5,300,919 | 4/1994 | Caddock | 338/250 |

FOREIGN PATENT DOCUMENTS

| 62-276801 | 12/1987 | Japan . |
| 63-107087 | 5/1988 | Japan . |
| 2271565 | 11/1990 | Japan . |
| 3-225943 | 10/1991 | Japan . |
| 3-257986 | 11/1991 | Japan . |

OTHER PUBLICATIONS

Hybrid IC Technology pp. 46–50 Jun. 1984.

Journal of Nippondenso Technical Disclosure, No. 55, Sep. 1987 re JP-A 55-163.

Journal of Nippondenso Technical Disclosure, No. 63, Jan. 1989 re JP-A 63-138.

Primary Examiner—Marvin M. Lateef
Attorney, Agent, or Firm—Cushman, Darby & Cushman

[57] ABSTRACT

An electronic circuit device decreases dispersion in the output of the circuit caused by changes in the resistance of the resistors resulting from stress. Resistor positions are selected on the circuit board so that a change in the circuit output caused by a change in resistance of a first resistor group becomes equal to a change caused by a change in resistance caused by a second resistor group, these changes being in opposite directions so as to cancel each other. Alternately, a plurality of resistors are connected to form a composite resistor such that the effect upon resistance of the composite resistor caused by the resistor having decreased resistance is cancelled by the effect upon resistance of the composite resistor caused by a resistor having an increased resistance.

9 Claims, 17 Drawing Sheets $$K = \left(1 + \frac{R2}{R1}\right)$$

ELECTRONIC CIRCUIT DEVICE

BACKGROUND OF THE INVENTION

1. Field of the Invention

The present invention relates to an electronic circuit device and, more specifically, to a package-type hybrid IC molded with resin.

2. Description of the Related Art

Conventional resin-packaged hybrid ICs can be divided into those of the SIP type and those of the DIP type depending upon their structure for providing leads out of the package. In the case of hybrid ICs molded with resin, the circuit board is inserted in advance in a metal mold or in a case and is sealed with a liquid or powdery thermosetting resin (such as an epoxy resin or a silicone resin) using a casting method, a dip method, a transfer method or a similar method.

However, the above-mentioned conventional hybrid ICs develop stress during the step in which the molding resin is heated and cured or during the step in which the resin contracts due to cooling. Moreover, residual stress develops between the molding resin and the circuit board due to differences in the coefficient of contraction and the coefficient of thermal expansion therebetween. These stresses act on the resistors which are secured to the circuit board and, as a result, the resistances of the resistors undergo a change due to stresses exerted thereon.

According to the test and analysis conducted by the present inventors, it was discovered that the compression stress and bending stress in a direction perpendicular to the surface act upon the circuit board due to the contraction of the molded resin portion, and the resistors are subjected to compression or tensile stress due to the bending stress. The bending stress varies depending upon the portions on the circuit board, whereby the resistance of a resistor may vary depending upon the position where it is formed on the circuit board and, hence, the circuit employing these resistors produces varying outputs.

The inventors have further confirmed the fact that the resistance of the resistors varies due to the stress exerted from outside the hybrid IC.

FIG. 32 illustrates a hybrid IC of the conventional SIP type. A circuit board 2a is accommodated in a case 1a, and circuit elements such as resistors R1, R2 and the like are formed on the circuit board 2a. Reference numeral 31a denotes a molded resin portion which is filled in the case 1a to prevent the circuit elements from getting wet and to fasten the circuit board. Reference numeral 9a denotes a protection glass that protects the resistors R1 and R2.

According to another example of the hybrid IC of the SIP type, a Silicon-Gel film is thinly applied to the whole surface of the circuit board 2a which is then accommodated in the case 1a followed by filling with the molding resin 3a.

According to the above-mentioned conventional resin-packaged hybrid IC, however, stress builds up between the sealing resin portion 3a and the circuit board 2a due to differences in the coefficient of contraction and the coefficient of thermal expansion therebetween during the step in which the sealing resin contracts upon curing or during the step in which the resin expands or contracts due to the subsequent heating or cooling. The stress acts upon the resistors R1 and R2 secured to the circuit board 2a and, hence, the resistances of the resistors R1 and R2 undergo a change due to the stress acting thereupon.

In the conventional hybrid IC constitution shown in FIG. 32, in particular, the elements are mounted on one main surface of the board 2a. Therefore, the board 2a is not mounted at a central position in the case 1a but is inevitably positioned so as to be deviated toward one side of the case.

When the board 2a is disposed so as to be deviated in the case 1a, a difference develops in the stress that is generated by the sealing resin 3a between the surface of the board on which the elements are mounted and the surface of the board on which no elements are mounted and, in addition, the sealing resin 3a is filled in different amounts in the space that is formed between one surface of the board 2a and the case 1a and in the space that is formed between the other surface of the board 2a and the case 1a. Due to these differences, therefore, different stresses build up on the two surfaces of the board 2a.

The present invention was accomplished in view of the above-mentioned problem, and its first object is to provide an electronic circuit device which is capable of decreasing dispersion in the output of the circuit that is caused by changes in the resistances of the resistors as a result of stress of hardening and contraction taking place between the molded resin portion and the circuit board, stress due to the difference in the coefficient of thermal expansion, and external stress.

A second object of the present invention is to provide an electronic circuit device which is capable of decreasing or eliminating changes in the resistances of the resistors caused by stress that builds up between the molded resin portion and the circuit board.

SUMMARY OF THE INVENTION

In order to improve defects inherent in the aforementioned prior art, the present invention employs the technical constitution that is described below.

That is, an electronic circuit device comprising:

a circuit board;

a circuit arranged on the circuit board and including first and second resistor groups each having one or more resistors that are secured to the circuit board;

a molded resin portion secured to the surfaces of the circuit board to cover the circuit; and leads that are secured at the ends on one side thereof to the circuit board and are outwardly protruding at the ends on the other side thereof penetrating through the molded resin portion;

wherein said two resistor groups are arranged at positions where a change is cancelled in the output of the circuit caused by changes in the resistances of the two resistor groups as a result of stress.

According to the present invention, there can be used, as resistors, thick-film resistors formed by printing and baking, as well as thin-film resistors formed by various PVD methods and CVD methods. These resistors can be secured to the circuit board by adhesion using an electrically conducting paste, an adhesive agent or soldering, or may be resistors that are directly formed on the circuit board. The resistors are mounted on the circuit board together with other passive circuit elements such as capacitors and active circuit elements such as ICs and transistors.

According to another embodiment of the present invention, the electronic circuit device comprises a circuit board and a composite resistor obtained by mutually connecting a plurality of resistors that are secured to both surfaces of the circuit board.

In a suitable embodiment, as in the aforementioned embodiment, the plurality of the resistors are arranged at positions where a change in the resistance of the composite resistor that is caused by changes in the resistances of the resistors as a result of stress, is prevented.

That is, in the circuit board molded with the resin, stress builds up between the sealing resin portion and the circuit board due to contraction of the sealing resin portion when it is being cured and due to the expansion and contraction caused by the subsequent heating and cooling, and the circuit board is warped by a difference in the stress acting upon the front surface and back surface of the circuit board. Moreover, the circuit board is warped by the force from the external side. The stress of the warping acts upon the molded resin portion and upon the first and second resistor groups that are secured onto the same surface of the circuit board, causing the two resistor groups to change their resistances.

Similarly, furthermore, when the resistors are arranged on both surfaces of the circuit board, a compressive stress is exerted on the resistors secured onto one surface of the circuit board and a tensile stress is exerted on the resistors secured onto the other surface thereof. The resistors receiving the compressive stress exhibit decreased resistances and the resistors receiving the tensile stress exhibit increased resistances.

According to the first embodiment of the present invention, the first resistor group and the second resistor group provided on the same surface or different surfaces of the circuit board are secured at such positions that the amount of change in the circuit output caused by the change in the resistances of the first resistor group becomes equal to the amount of change in the output of the circuit caused by the change in the resistances of the second resistor group, and that their directions of change (directions of increase or decrease) are opposite to each other.

As a result, a change in the circuit output is almost cancelled irrespective of changes in the resistances of the two resistor groups caused by stress, and an electronic circuit device of high precision can be realized.

According to the second embodiment of the present invention, the plurality of resistors provided on different surfaces of the circuit board are mutually connected together to constitute a composite resistor, and a change in the resistance of the composite resistor caused by the resistor exhibiting a decreased resistance cancels part or whole of a change in the resistance of the composite resistor caused by the resistor exhibiting an increased resistance.

This helps decrease or cancel the change in the resistance of the composite resistor secured to the circuit board despite the circuit board is deformed by the external force or the stress between the sealing resin portion and the circuit board.

DETAILED DESCRIPTION OF THE PREFERRED EMBODIMENTS

An example of the electronic circuit device according to the present invention will now be described in detail with reference to the drawings.

First, the electronic circuit device according to a first aspect of the present invention comprises:

a circuit board 2;

a circuit arranged on the circuit board 2 and including first and second resistor groups (R1, R2), (R3, R4) each having one or more resistors that are secured to the circuit board;

a molded resin portion 3 secured to the surfaces of the circuit board 2 to cover the circuit: and leads 4 that are secured at the ends on one side thereof to the circuit board 2 and are outwardly protruding at the ends on the other side thereof penetrating through the molded resin portion 3;

wherein the two resistor groups (R1, R2), (R3, R4) are arranged at positions where a change is cancelled in the output of the circuit that is caused by changes in the resistances of the two resistor groups as a result of stress.

That is, the fundamental technical constitution of the present invention resides in that the positions for arranging the resistors are determined by taking into consideration the amount of deformation of the circuit board and the amounts of change of resistance of the resistors due to the deformation of the board, in order to compensate for changes in the resistances of the resistors arranged on the circuit board 2 that are caused as the circuit board 2 is deformed by the molding with resin and the like. This technical constitution holds true even when the resistors are arranged on the same surface or on different surfaces of the circuit board.

An example according to the first aspect of the present invention will now be described as an embodiment 1 with reference to FIGS. 1 to 10.

[Embodiment 1]

Figure 1:
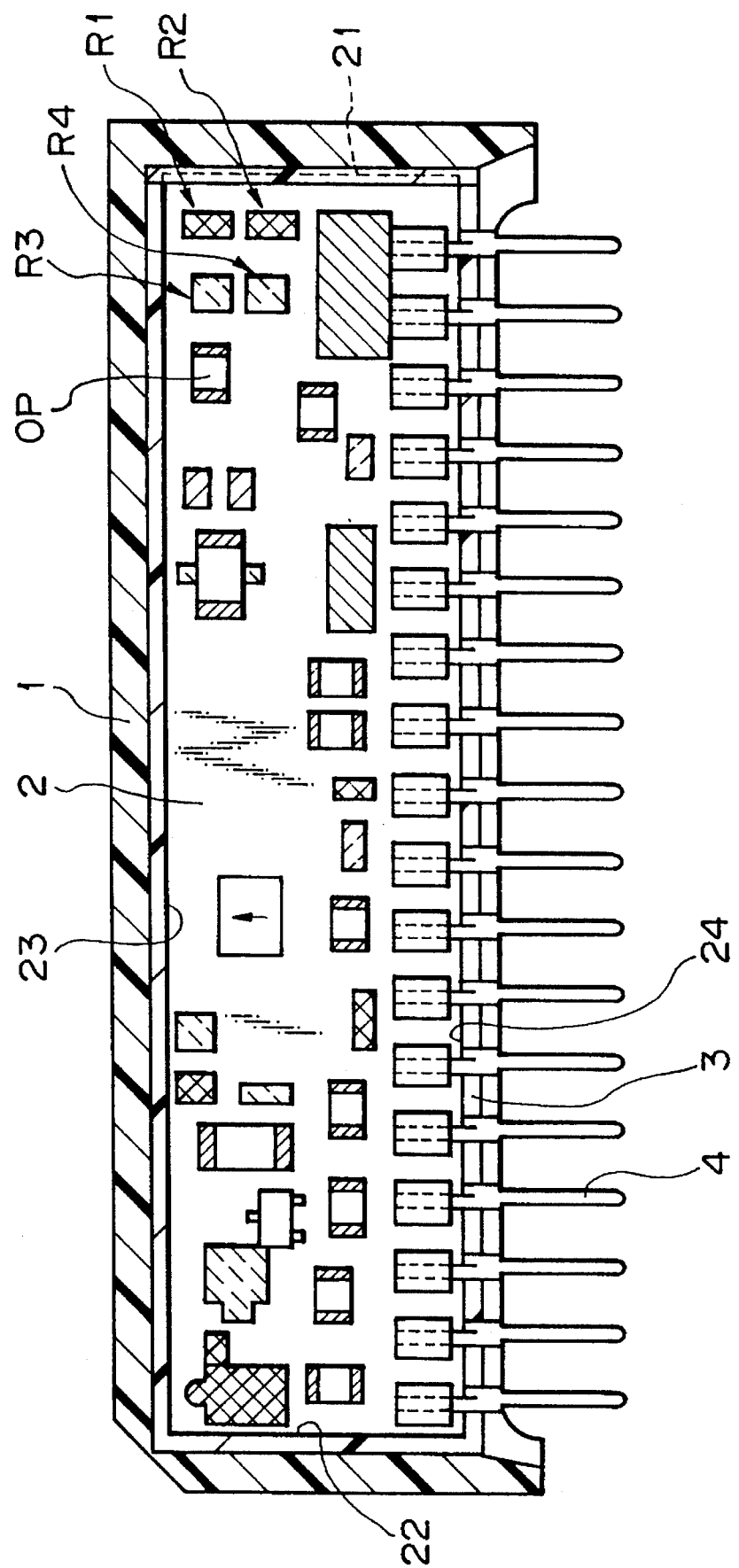
FIG. 1 is a plan view which schematically illustrates the constitution of an electronic circuit device according to a first aspect of the present invention.

This electronic circuit device is a hybrid IC comprising a case 1, a circuit board 2 accommodated in the case 1, a molded resin portion 3 filled in the case 1, and leads 4 which are secured at the ends on one side thereof to the circuit board 2 and are outwardly protruding at the ends on the other side penetrating through the molded resin portion 3. In FIG. 1, the molded resin portion 3 on the main surface of the circuit board 2 is shown in the as being peeled away.

Figure 3:
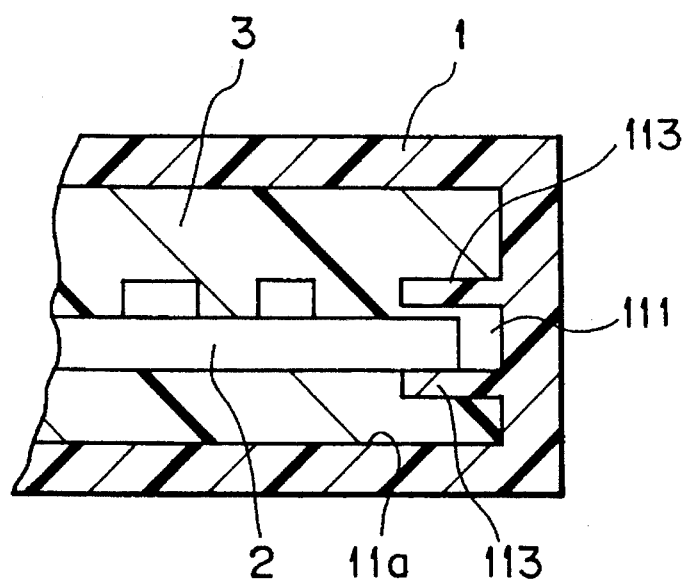
FIG. 3 is a sectional view illustrating on an enlarged scale a portion of an engaging means between a case and a circuit board in the electronic circuit device according to the present invention.
Figure 4:
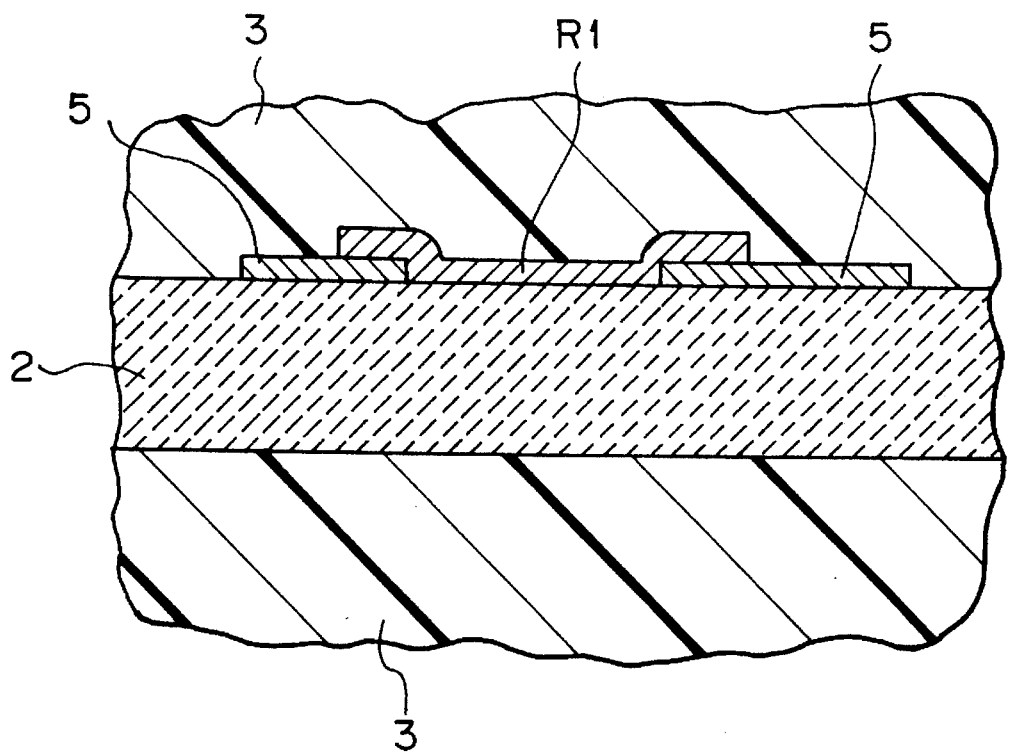
FIG. 4 is a sectional view illustrating on an enlarged scale a portion of the resistor in the electronic circuit device according to the present invention.
Figure 5:
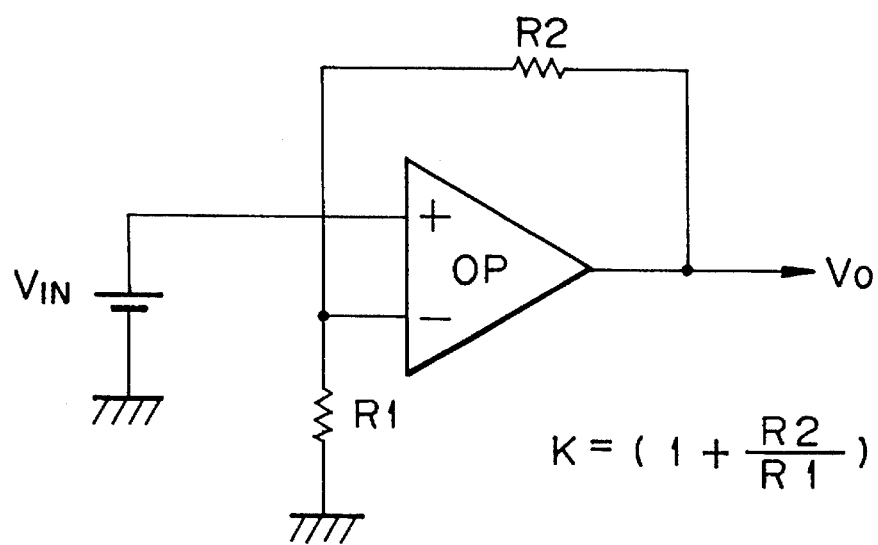
FIG. 5 is a diagram of an equivalent circuit of a logic circuit formed in the electronic circuit device of the present invention.

The case 1 has a rectangular parallelepiped hollow shape measuring 18 mm×50 mm×6 mm in length, width and height, and has a bottom that is open. The case 1 has a wall of a thickness of about 1 mm and is formed by injection-molding a PBT resin. At both inner ends in the lengthwise direction of the case 1 are formed, as shown in FIG. 3, a pair of guide protrusions 11 protruding in parallel to guide and position the circuit board 2.

As will be obvious from FIG. 1, the circuit board 2 is a multi-layer board composed of aluminum, and the two short sides 21 and 22 of the circuit board 2 are loosely inserted and held between the pair of guide protrusions 11. The circuit board 2 has a size of 13 mm×47.5 mm×0.8 mm in length, width and thickness, and has a coefficient of linear expansion of about $7.5\times10^{-6}$/°C. On the circuit board 2 is formed a single-layer or multi-layer wiring pattern (not shown). Onto one surface of the circuit board 2 are secured a variety of circuit parts which are electrically connected. In this embodiment, in particular, resistors R1 and R2 are secured onto the circuit board 2 close to the short side 21 thereof or at a distance of about 2 mm from the short side 21 thereof and, similarly, resistors R3 and R4 are secured onto the circuit board 2 close to the short side 21 thereof or at a distance of about 4.6 mm from the short side 21 thereof.

The resistors R1 and R2 have a rectangular parallelepiped shape measuring 1.5 mm×0.85 mm×10 μm in length, width and thickness, and their lengthwise directions are in parallel with the short side 21. As partly illustrated on an enlarged scale in FIG. 4, the resistors R1 to R4 are thick-film resistors composed of RuO2, and are formed on the circuit board 2 by printing and baking. Reference numeral 5 denotes a wiring layer of the Ag type and has a thickness of about 10 μm.

Figure 2:
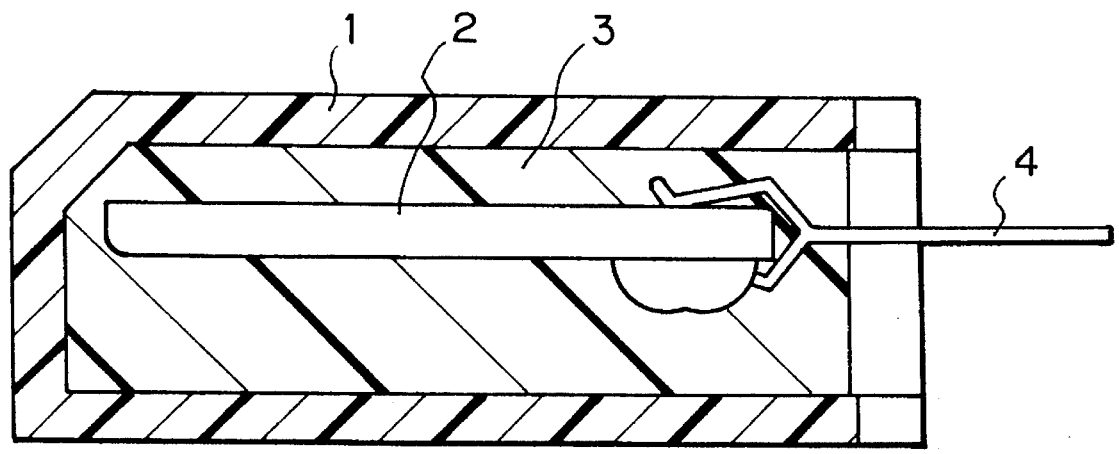
FIG. 2 is a sectional view which schematically illustrates the constitution of the electronic circuit device according to the present invention.

The molded resin portion 3 is formed as shown in FIG. 2 by first inserting the circuit board 2 in the case 1, and then pouring a molten epoxy resin (at about 40 degrees centigrade) into the case 1 maintained at a normal temperature, followed by thermosetting and cooling. The epoxy resin has a coefficient of linear expansion of about $51\times10^{-6}$/°C. and a coefficient of volume contraction of about 96% when it is cured from the molten state and is cooled to normal temperature.

The circuit on the circuit board 2 has a first-stage sense amplifier (see FIG. 5) which consists of a monolithic operational amplifier OP and resistors R1, R2, the operational amplifier circuit having a voltage amplification factor k of (1+R2/R1).

Figure 6:
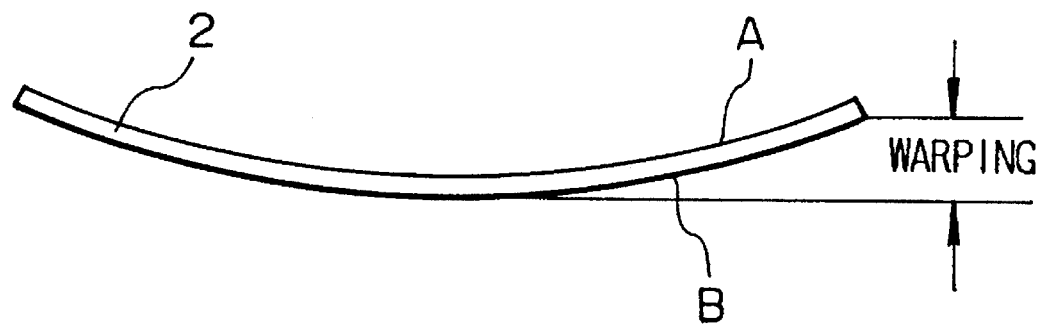
FIG. 6 is a schematic diagram explaining the warping which is a deformation of the circuit board.

The above-mentioned hybrid IC warps as schematically shown in FIG. 6 toward the side of the circuit element-mounting surface A due to the contraction when the molded resin portion 3 is cured by cooling. This is because, the amount of the molded resin on the side of the circuit element-mounting surface A is greater than the amount of the molded resin on the side of the back surface, and the compressive force exerted on the circuit element-mounting surface A of the circuit board 2 (particularly, in the lengthwise direction thereof) becomes greater than the force exerted on the back surface B, causing the central portion of the circuit board 2 to be warped in a direction in which the circuit element-mounting surface A is recessed with respect to both short sides 21, 22 of the circuit board 2. The amount of warping, i.e., the residual stress changes depending upon the temperature as a matter of course. The central portion of the circuit board 2 is also warped in a direction in which the circuit element-mounting surface A is recessed with respect to both long sides 23 and 24 of the circuit board 2. This amount of warping, however, is relatively small and is neglected in this embodiment.

The circuit elements secured onto the circuit element-mounting surface A help locally reinforce the rigidity of the circuit board 2, resulting in a dispersion in the amount of warping and in the distribution of stress which, however, is neglected in this embodiment.

Due to the warping of the circuit board 2 (i.e., bending stress in a direction perpendicular to the circuit board 2), the compressive stress is exerted on the resistors R1 and R2 secured thereon.

Figure 7:
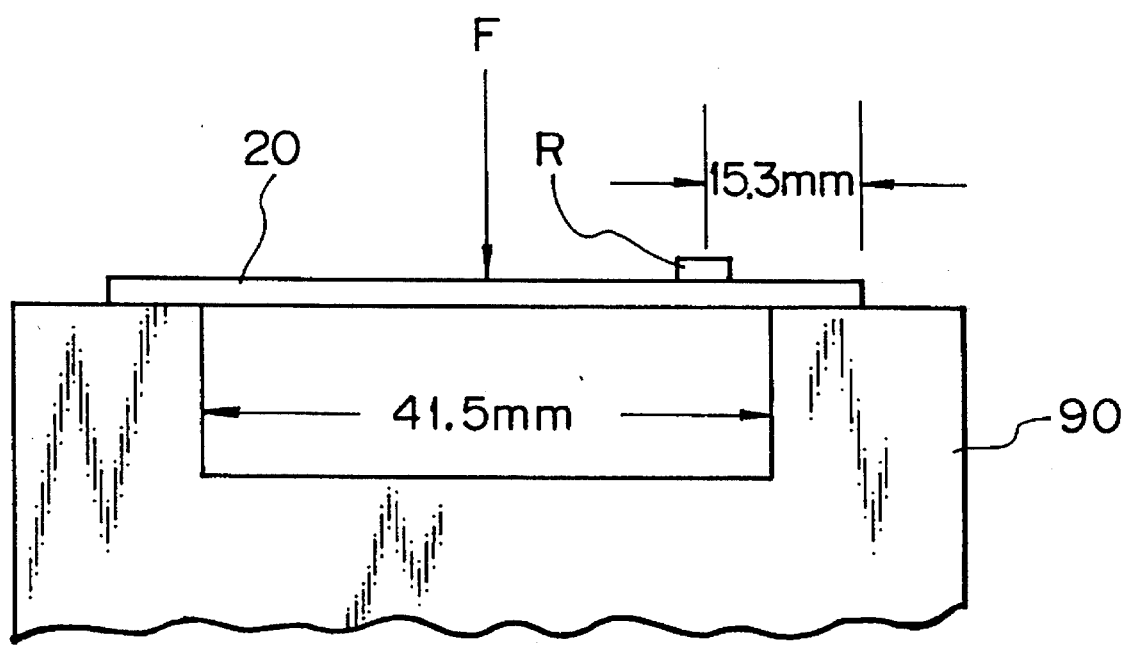
FIG. 7 is a schematic diagram explaining a testing device for testing a relationship between the bending force given to the circuit board and a change of resistance of the resistor.

The inventors have examined the relationship between the stress exerted on the circuit board 2 and changes in the resistances of the resistors secured to the circuit board. The circuit board 2 for testing had a size of 13 mm×47.5 mm×0.8 mm in length, width and thickness as shown in FIG. 7, and was supported at both its ends in the lengthwise direction thereof by a bedplate 90. The resistor R was secured at a position 15.3 mm away from the short side 21 of the circuit board 2, and the central portion of the circuit board 2 was depressed toward the circuit board 2 to examine the change in the resistance. The results were as shown in FIG. 8.

Figure 8:
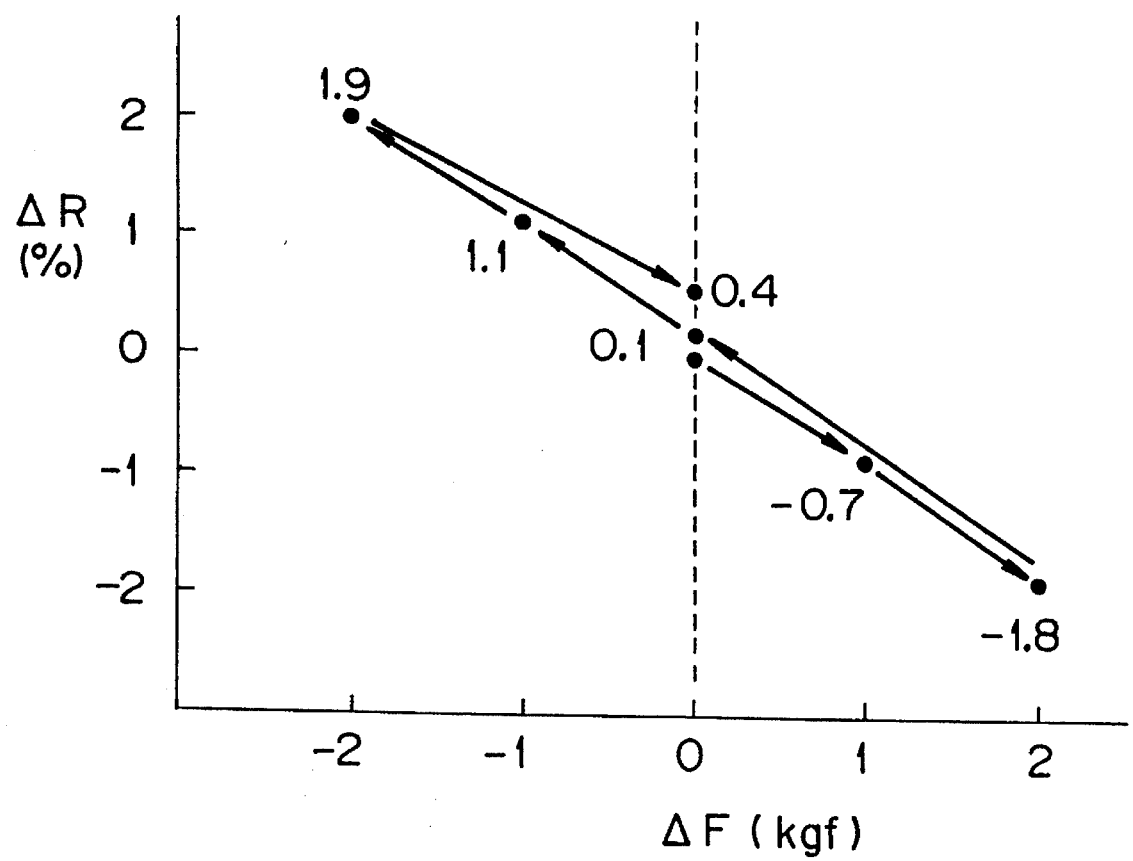
FIG. 8 is a diagram of characteristics illustrating the results of tests by the testing device of FIG. 7.

FIG. 8 shows that there exists nearly a linear relationship between the pushing force (bending stress) ΔF and a change ΔR in the resistance, and that a decreased resistance is exhibited when the compressive stress is exerted on the resistor R1 as the circuit board 2 is curved by the pushing force and an increased resistance is exhibited when the tensile stress is exerted on the resistor R1. In this embodiment, the lengthwise direction of the resistor R1, i.e., the direction in which the current flows, is in the lengthwise direction of the circuit board 2. However, it was also learned that a decreased resistance is exhibited when the compressive stress is exerted on the resistor R1 and an increased resistance is exhibited when the tensile stress is exerted on the resistor R1 even when the lengthwise direction of the resistor R1 is changed, i.e., even when the current-flowing direction is changed relative to the lengthwise direction of the circuit board 2.

Figure 9:
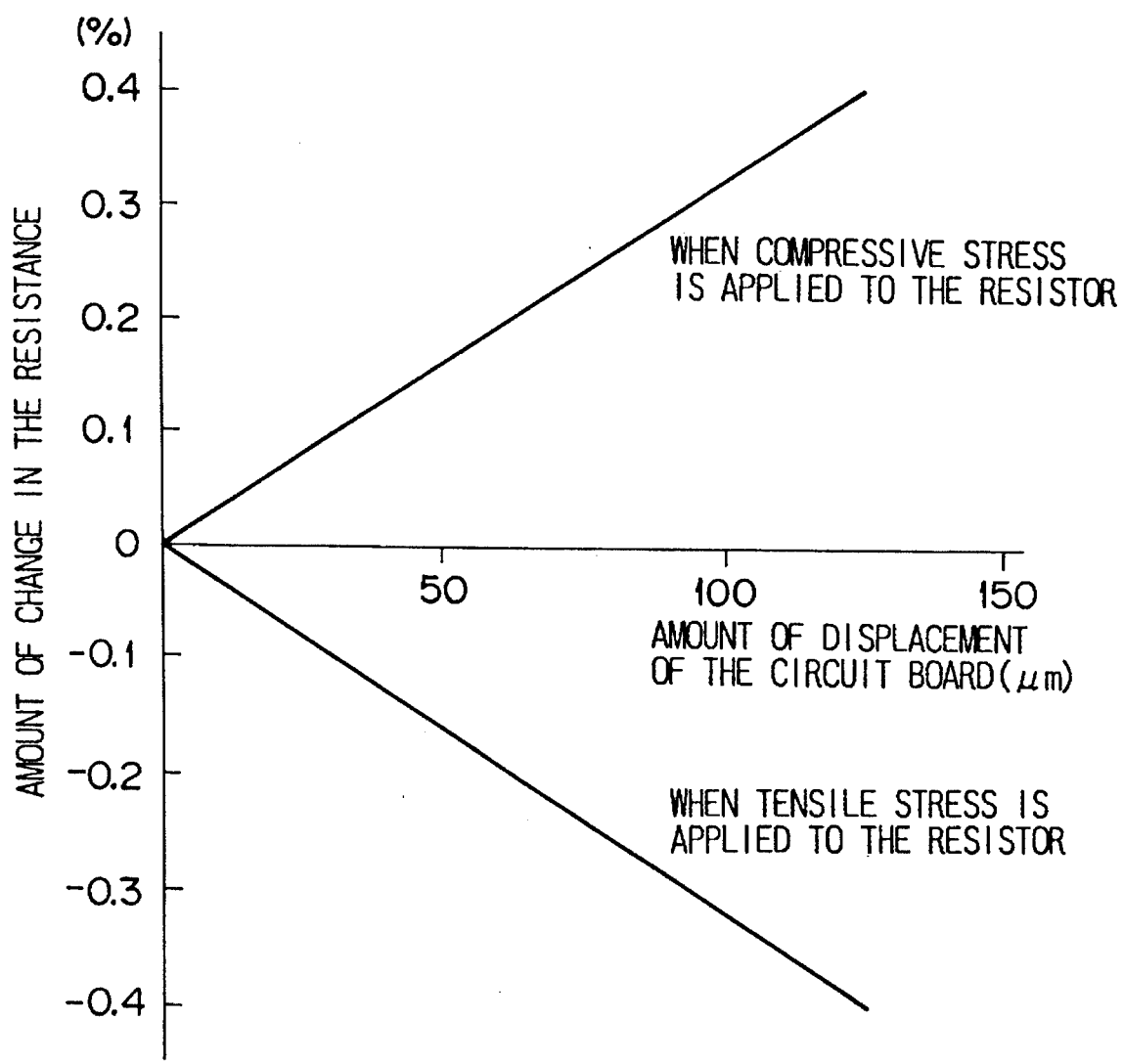
FIG. 9 is a diagram of characteristics explaining a relationship between the amount of displacement of the circuit board and the amount of change in the resistance of the resistor.

The inventors have further examined the relationship between the amount of warping (amount of displacement) of the circuit board 20 of FIG. 7 and the amount of change of the resistance. The results were as shown in FIG. 9. Here, the amount of warping is maximum at the center of the board.

Figure 10:
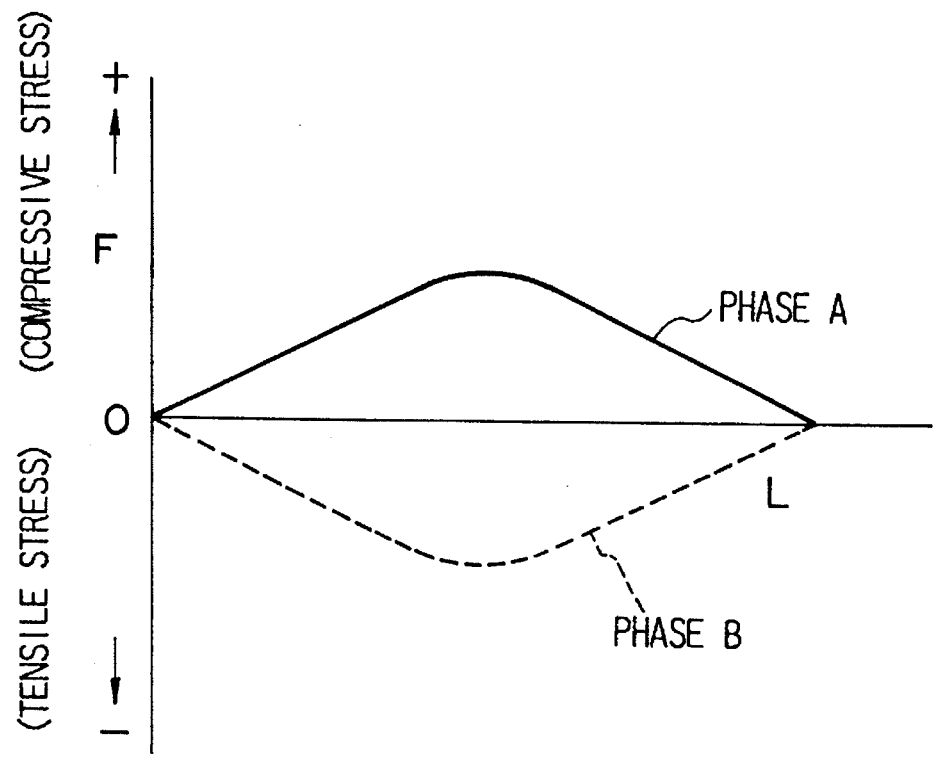
FIG. 10 is a diagram of characteristics showing a change in the stress exerted on the resistor in the lengthwise direction of the circuit board which is undergoing the warping.

When the central portion of the circuit board 2 is pushed while supporting both of its short sides 21 and 22, the compressive or tensile stress acting upon each of the portions in the lengthwise direction of the circuit board 2 due to the resilient deformation of the circuit board 2 becomes maximum at the central portion as shown in FIG. 10 and nearly 0 at both short sides 21 and 22, the stress changing continuously (nearly linearly).

The inventors have further examined a change in the resistance of the resistor R in the case when the circuit board 2 having the resistor R secured at the above-mentioned position is accommodated in the case 1 and is molded for its entire surface with the molding resin. As a result, the resistor R1 exhibited a change in resistance of about −0.7% in average value at room temperature.

According to this embodiment as described above, the resistors R1 and R2 are secured at an equal distance in the lengthwise direction of the circuit board 2 from the short side 21. As a result, an equal compressive stress is exerted on the resistors R1 and R2 via the circuit board 2, and the resistors R1 and R2 exhibit an equal change in the resistance.

The operational voltage amplifier circuit using the resistors R1 and R2 has a voltage amplification factor k which is (1+R2/R1). Therefore, the effect by warping of the circuit board 2 is cancelled by the output characteristics (voltage amplification factor k) of the operational voltage amplifier circuit.

In this embodiment, furthermore, the resistors R1 and R2 are arranged close to the short side 21 and, hence, a small compressive stress acts upon the resistors in proportion to the bending stress of the circuit board 2, and a difference in the compressive stress can be decreased. As a result, the effect by the warping of the circuit board 2 is decreased by the output characteristics (voltage amplification factor k) of the operational voltage amplifier circuit.

In this embodiment, furthermore, the resistors R1 and R2 in the lengthwise direction thereof are arranged in parallel with the short side 21. This makes it possible to decrease dispersion of compressive stress acting upon the resistors R1 and R2 and, hence, to decrease dispersion of resistance of the resistors R1 and R2.

Accordingly, it is made possible to greatly decrease dispersion of the voltage amplification factor of the first-stage sense amplifier consisting of the operational voltage amplifier circuit. Usually, the voltage amplification factor of the first-stage sense amplifier that amplifies a very small input signal voltage or a signal current must have a markedly improved stability compared with circuits of the subsequent stages that handle large signal voltages. According to this embodiment, dispersion in the voltage amplification factor is greatly decreased, making the circuit itself well suited for being used as the first-stage sense amplifier.

Figure 11:
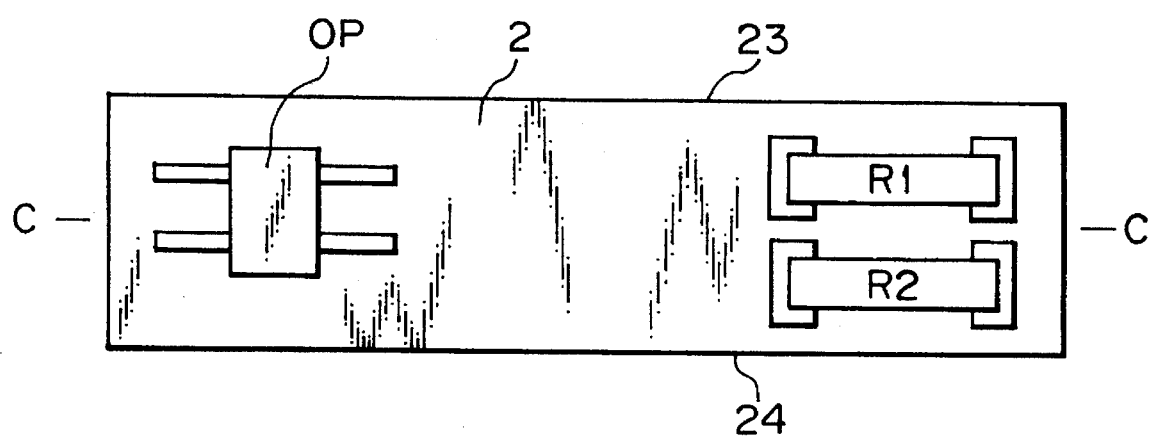
FIGS. 11 to 13 are plan views explaining other examples according to the first aspect of the present invention.
Figure 12:
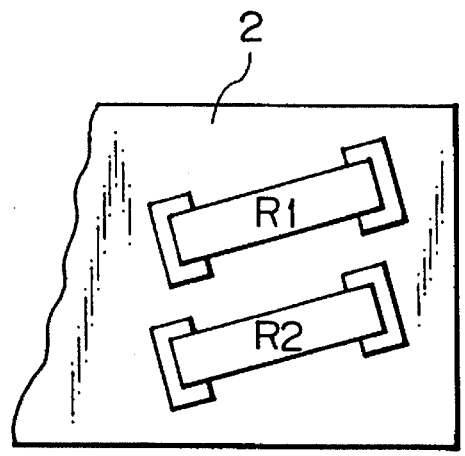
Figure 13:
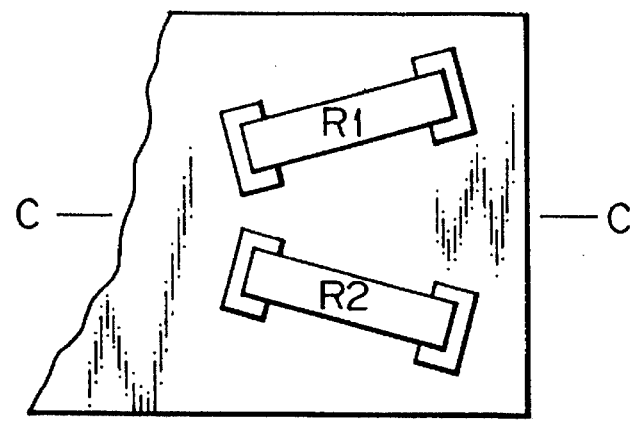

As shown in FIG. 11, furthermore, the resistors R1, R2 in the lengthwise direction thereof may be arranged in parallel with the long sides 23 and 24 of the circuit board 2. Or, as shown in FIG. 12, the resistors R1, R2 in the lengthwise direction thereof may be arranged maintaining a predetermined angle relative to the lengthwise direction of the circuit board 2. As shown in FIG. 13, furthermore, the resistors R1, R2 may be arranged in a relationship of image by inversion with a reference line in the lengthwise direction of the circuit board 2 as a center.

In FIGS. 11 and 13, in particular, the resistors R1 and R2 are symmetrically arranged with a center line C extending in the lengthwise direction of the circuit board 2 as a reference, presenting such an effect that the resistors R1 and R2 exhibit an equally increased resistance as the long sides 23 and 24 of the circuit board 2 are curved relative to the center line C.

In this embodiment, attention was given to the possibility that a difference may develop in the stress acting upon the different surfaces of the board due to the sealing resin 3 even when the board 2 is located at the center in space in the case 1. When the board 2 is arranged so as to be deviated in the case 1 as shown in FIG. 2, furthermore, the difference in the stress becomes even greater. Even with this constitution, however, the above-mentioned embodiment makes it possible to prevent the generation of stress and to efficiently cancel the dispersion among the resistors.

Next, another example according to the above-mentioned aspect of the present invention will be described as an embodiment 2.

[Embodiment 2]

Figure 14:
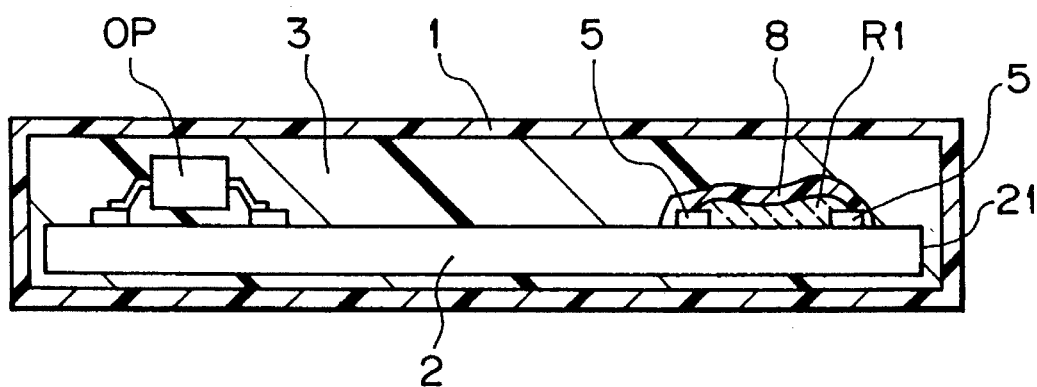
FIG. 14 is a sectional view for explaining the constitution of a second embodiment according to the first aspect of the present invention.

In the aforementioned embodiment 1, the molded resin portion 3 composed of an epoxy resin was formed in direct contact with the circuit board 2 and the circuit elements thereon. As shown in FIG. 14, however, it is also allowable to coat the circuit elements inclusive of the resistors R1, R2 with a soft gel-like silicone resin layer 8 and, then, form the molded resin portion 3. It then becomes possible to decrease the compressive stress acting upon the resistors R1 and R2. Reference numeral 5 denotes a wiring electrode.

It was found that the circuit board 2 is curved because the amount of the molded resin on the side of the circuit element-mounting surface A is greater than the amount of the molded resin on the side of the back surface B and, hence, the force of contraction acting on the circuit element-mounting surface A becomes overwhelming, causing the circuit board 2 to be bent toward the side of the circuit element-mounting surface A. Therefore, if the force of contraction (bending stress) of the molded resin portion 3 acting upon the circuit element-mounting surface A is decreased by covering the circuit element-mounting surface A with the gel-like silicone resin layer 8, then the circuit board 2 is curved very little or is not curved at all, making it possible to obtain a stable voltage amplification factor compounded by the effect of arranging the resistors R1 and R2 in a pair as in the embodiment 1.

Yet further examples according to the above-mentioned aspect of the present invention will be described below as Embodiments 3 to 9.

[Embodiment 3]

Figure 15:
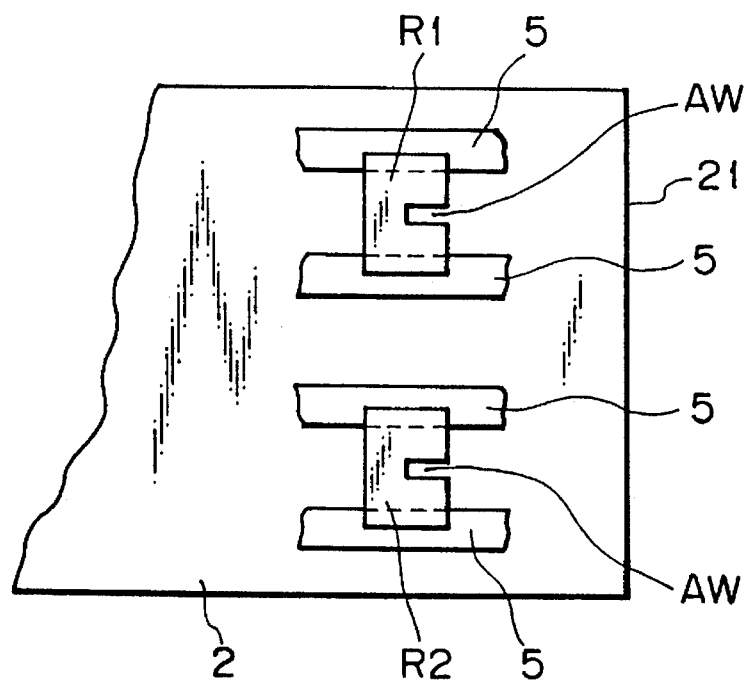
FIGS. 15 to 19 are plan views and sectional views for explaining the constitution of the electronic circuit device according to third to seventh embodiments in the first aspect of the present invention.

The constitution of embodiment 3 is shown in FIG. 15.

In this embodiment, the resistors R1 and R2 are trimmed with a laser beam, and the distances are set to be nearly equal from the short side 21 to the regions Aw melt-cut by laser trimming.

Then, the distances become substantially equal from the short side 21 to the resistors R1 and R2 even after the laser trimming, and the resistances increase by nearly an equal amount as the circuit board 2 is curved enabling dispersion in the resistances to be cancelled.

[Embodiment 4]

Figure 16:
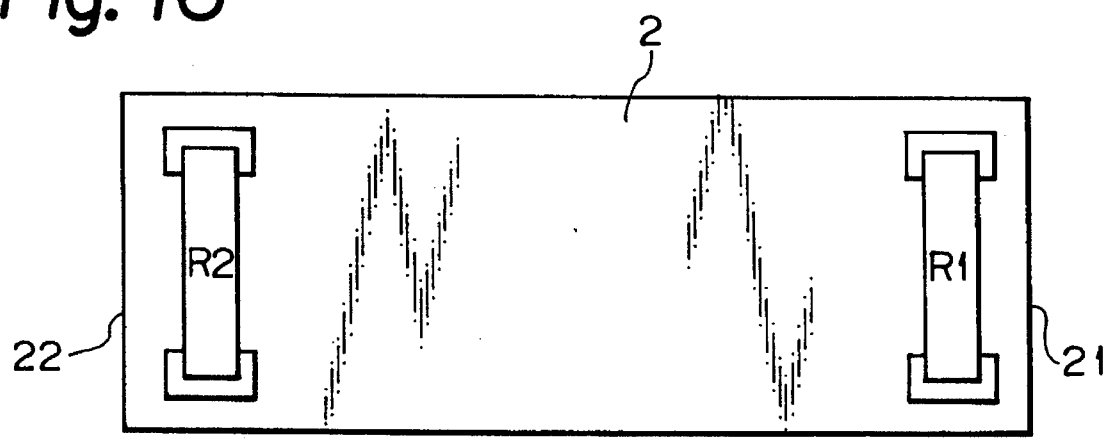

The constitution of embodiment 4 is shown in FIG. 16.

In this embodiment, the distance from the short side 21 to the resistor R1 is set to be equal to the distance from the short side 22 to the resistor R2.

This constitution permits the resistors R1 and R2 to change resistance at nearly the same rate, and enables dispersion in the resistances to be cancelled.

[Embodiment 5]

Figure 17:
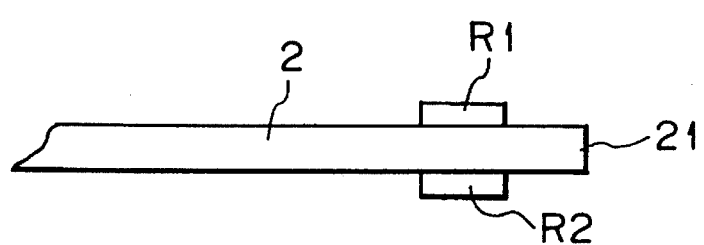

The constitution of embodiment 5 is shown in FIG. 17.

In this embodiment, the resistors R1 and R2 are separately secured to the front surface and back surface of the circuit board 2 at positions an equal distance from the short side 21 in the lengthwise direction of the circuit board 2.

When the resistor R1 has a resistance r1 and the resistor R2 has a resistance r2, the output (output voltage, output current or output frequency) of the circuit using the resistors R1, R2 has any functional value with (r1×r2) or (r1+r2) as a variable.

The increase in resistance of the resistor R1 and the decrease in resistance of the resistor R2 are thus cancelled by the product or the sum thereof.

[Embodiment 6]

Figure 18:
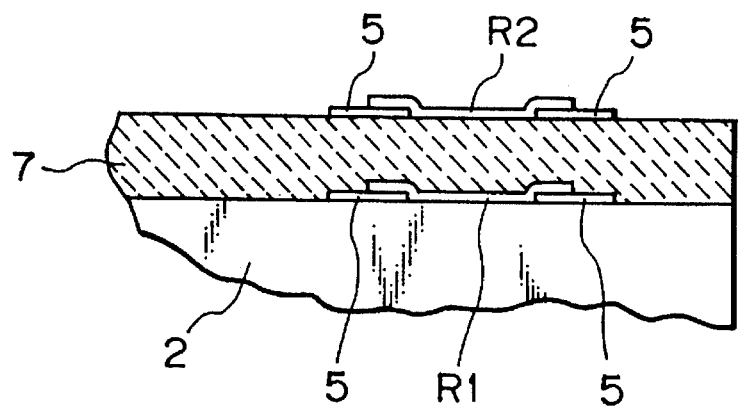

The constitution of embodiment 6 is shown in FIG. 18.

In this embodiment, the resistors R1 and R2 are secured being superposed in the thickness direction at positions by an equal distance from the short side 21 in the lengthwise direction of the circuit board 2. That is, after the resistor R1 is secured onto the circuit board 2, an interlayer glass film 7 is applied onto the circuit board 2, and the resistor R2 is secured thereon. The interlayer glass film 7 has a thickness of about 0.05 mm. The interlayer glass film 7 is much thinner than the circuit board 2 which has a thickness of 0.8 mm, and the compressive stresses exerted on the two resistors R1 and R2 can be approximated to be nearly equal to each other. The compressive stress acting on the resistor R1 of the inner side is slightly smaller than the compressive stress acting on the resistor R2 of the outer side. Therefore, the resistor R1 of the inner side may be displaced slightly more toward the center in the lengthwise direction of the circuit board 2 than the resistor R2 of the outer side.

According to this embodiment, the distances are equal from the long side 23 of the circuit board 2 making it possible to even cancel the compressive stress in a direction in parallel with the short side acting upon the resistors R1 and R2 that stems from the bending stress toward the direction in which the short sides 21 and 22 of the circuit board 2 are curved.

[Embodiment 7]

Figure 19:
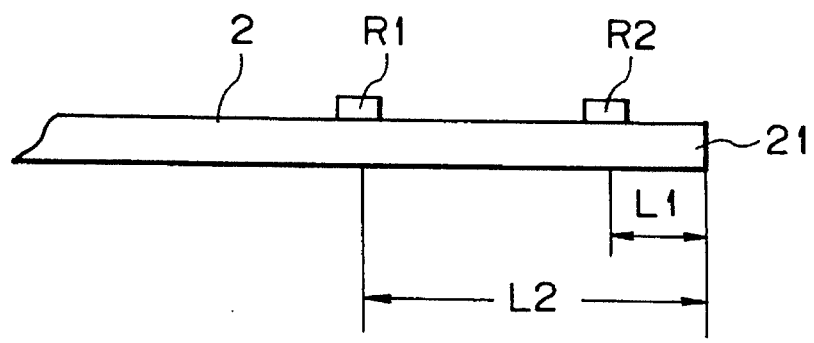

The constitution of embodiment 7 is shown in FIG. 19.

In this embodiment, the resistor R1 is secured on the surface of the circuit board 2 at a position a distance L1 from the short side 21 in the lengthwise direction of the circuit board 2 and the resistor R2 is secured on the same surface at a position a distance L2 from the short side 21 (or the short side 22) in the lengthwise direction of the circuit board 2.

When the resistor R1 has a resistance r1 and the resistor R2 has a resistance r2, the output (output voltage, output current or output frequency) of the circuit employing the resistors R1 and R2 can have any functional value with (r1−a×r2) as a variable. Here, a is a constant equal to resistance increment $\Delta r1$ of the resistor R1/resistance increment $\Delta r2$ of the resistor R2. Then, the above variable (r1−a×r2) becomes (r1+$\Delta r1$−a×r2−a×$\Delta r2$). Here, since $\Delta r1$= a×$\Delta r2$, changes in the resistances of the resistors R1 and R2 are cancelled.

The embodiment 7 deals with the case where the increments in resistance of the resistors R1 and R2 vary in linear proportion to the distance from the short side 21.

[Embodiment 8]

Figure 21:
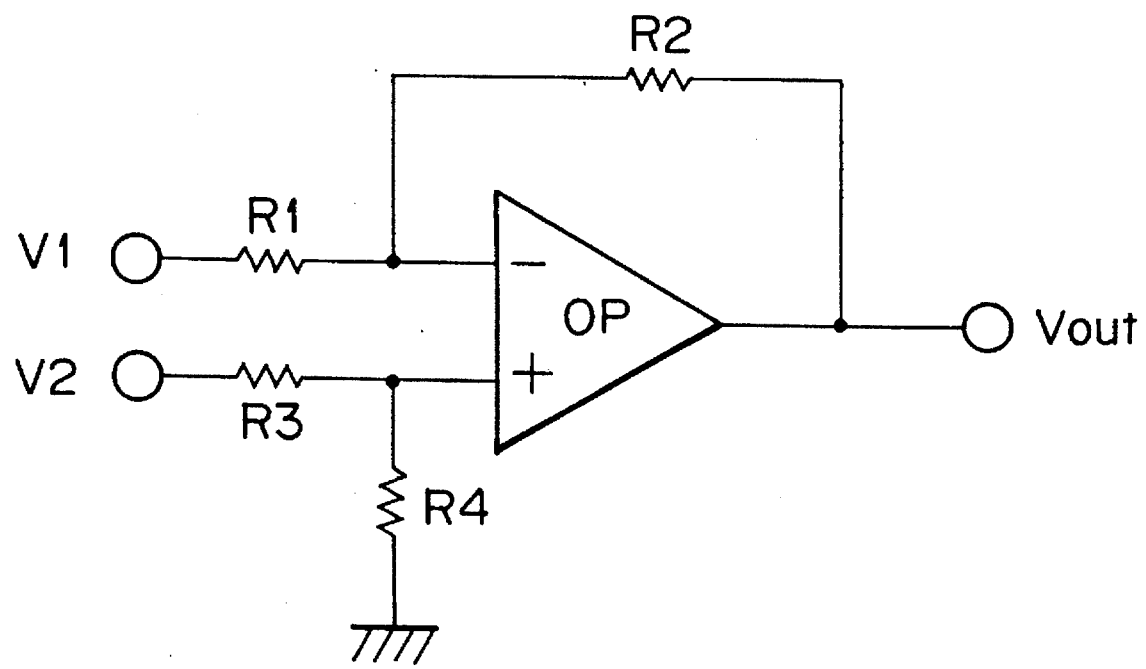
FIGS. 21 and 22 are a diagram of an equivalent circuit and a plan view for explaining the constitution of an eighth embodiment according to the first aspect of the present invention.
Figure 22:
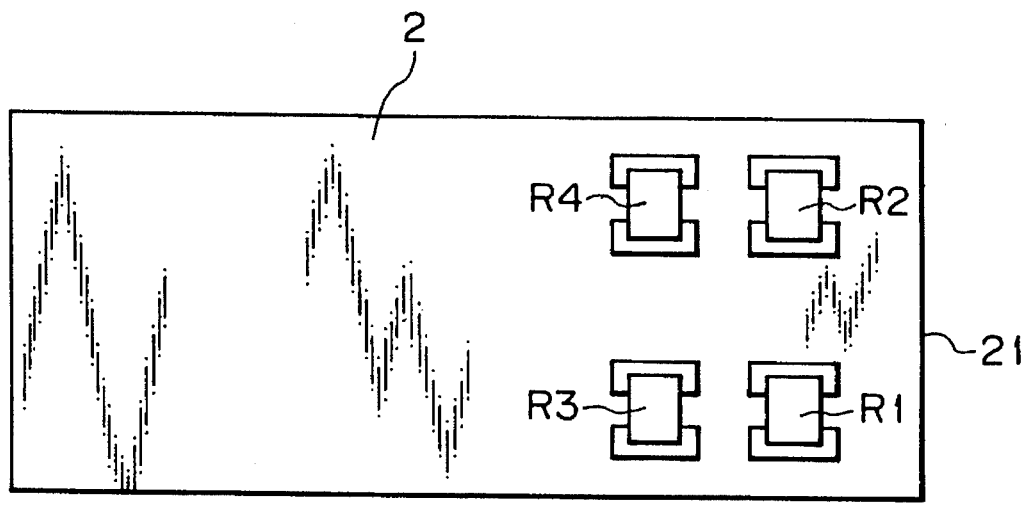

The constitution of Embodiment 8 is shown in FIGS. 21 and 22.

This embodiment deals with a first-stage sense amplifier made up of an operational voltage amplifier circuit using resistors R1 to R4, wherein the resistors R1 to R4 are arranged in the same manner as in FIG. 1. That is, the resistors R1 and R2 are arranged at positions an equal distance from the short side 21 in the lengthwise direction of the circuit board 2, and resistors R3 and R4 are arranged at positions an equal distance from the short side 21 in the lengthwise direction of the circuit board 2. When the resistor R1 has a resistance r1, the resistor R2 a resistance r2, the resistor R3 a resistance r3 and the resistor R4 has a resistance r4, the voltage amplification factor K of the sense amplifier is given as, $$V_{out} = \frac{r_1 + r_2}{r_3 + r_4} \times \frac{r_4}{r_1} V_2 - \frac{r_2}{r_1} V_1$$

This cancels the effect on the voltage amplification factor K caused by dispersions of resistances r1 to r4 stemming from the distorted circuit board 2.

[Embodiment 9]

Figure 23:
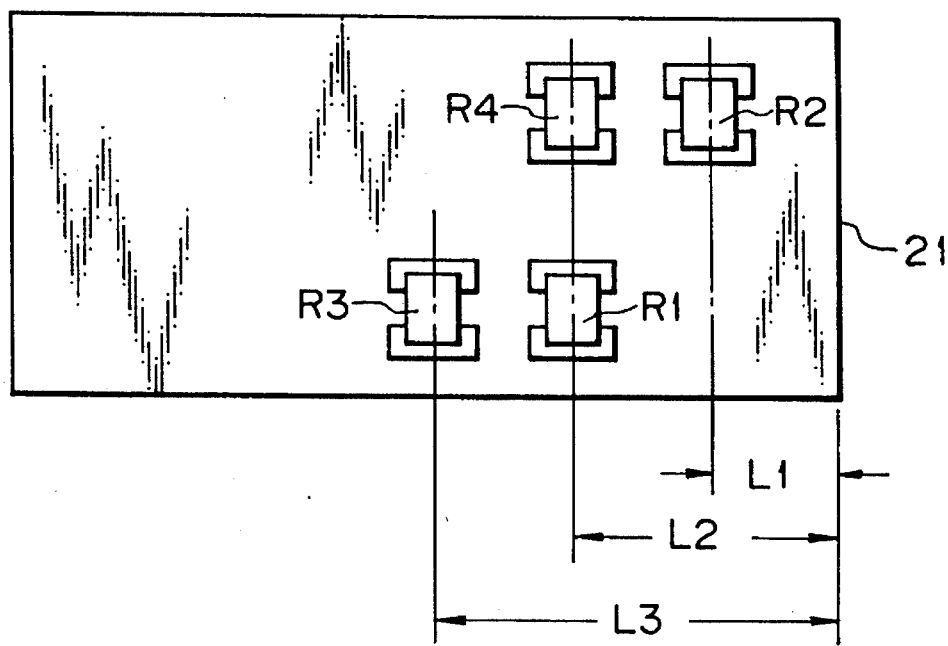
FIG. 23 is a plan view for explaining the constitution of a ninth embodiment according to the first aspect of the present invention.

The constitution of embodiment 9 is shown in FIG. 23.

In embodiment, the arrangement of the resistors R1 to R4 is changed from the embodiment 8. That is, in this embodiment, the resistor R2 is secured at a distance L1 from the short side 21, the resistors R1 and R4 are secured at a distance L2 from the short side 21, and the resistor R3 is secured at a distance L3 from the short side 21. Moreover, a relation L1/L2=L2/L3 has been set.

Here, the compressive stress exerted on the resistors R1 to R4 due to the curved circuit board 2 is 0 at the short side 21 and increases nearly in proportion to the distance from the short side 21 in the lengthwise direction of the circuit board 2. Even in this case, the amplification factor K does not change, as a matter of course.

What is learned from this embodiment is that changes in the resistances of the resistor groups consisting of many resistors are cancelled by so setting the arrangement of the first and second resistor groups on the circuit board 2 so that the effect on the output characteristics of the circuit due to a change in the second resistor groups (resistors R3 and R4 are included here) caused by the curved circuit board 2 is cancelled by the effect on the output characteristics of the circuit due to a change in the first resistor group (resistors R1 and R2 are included here) caused by the curved circuit board 2.

The above-mentioned embodiment has explained the application of the invention to an operational voltage amplifier circuit. It should, however, be noted that the invention can be extensively applied to a variety of circuits such as current amplification, waveform processing, frequency processing, digital processing comparator, A/D conversion and D/A conversion circuits, and can particularly preferably be applied to the first-stage unit in a circuit that requires the highest possible precision.

In the aforementioned embodiments, the distances L1 to L3 were set with the short side where the compressive stress becomes 0 as a reference position. The distances, however, can be set to a position where the compressive stress becomes maximum as a reference position.

In an embodiment according to the first aspect of the present invention, the output of the circuit is a function of the ratio of the two resistances, the two resistor groups are each constituted by one resistor, and changes in the resistances of the two resistors receiving stress are set to be nearly equal to each other. According to another embodiment, furthermore, the output of the circuit is a function of the product of the two resistances, the two resistor groups are each constituted by one resistor, and the product of changes in the resistances of the two resistors receiving stress is set to be nearly 1.

According to a further embodiment of the present invention, the output of the circuit is a function of R1+KR2 where R1 and R2 denote resistances and K denotes a constant, the two resistor groups are each constituted by one resistor, and a change $\alpha$ in the resistance R1 of the resistor receiving stress and a change $\beta$ in the resistance R2 of the resistor receiving stress are set to be K=$\alpha/\beta$.

According to a particularly preferred example related to the aforementioned embodiments, the two resistors are arranged at such positions as to receive stress of an equal magnitude and in attitudes of an equal angle between the lengthwise direction of the resistors and the direction of the stress, the two resistors being disposed at positions of an equal distance from one short side of the circuit board or being disposed at positions of an equal distance from both short sides of the circuit board.

According to the preferred example of the present invention, furthermore, the two resistors may be arranged at the edges of the board, and the lengthwise direction of the two resistors may be in parallel with the short side of the board.

Next, examples according to a second aspect of the present invention will be described below as embodiments 10 to 12.

[Embodiment 10]

Figure 24:
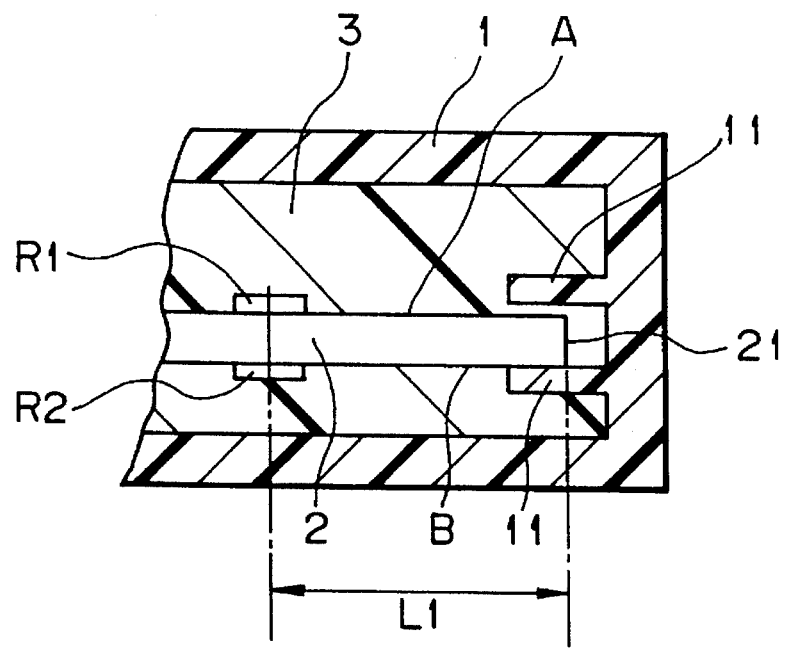
FIG. 24 is a sectional view illustrating the constitution of the electronic circuit device according to the second aspect of the present invention.

The electronic circuit used in the example has a constitution which is basically the same as the one illustrated in FIGS. 1 and 2, but what makes a difference is that the resistors R1 and R2 are arranged as shown in FIG. 24, unlike that of FIG. 3.

That is, in this embodiment, in particular, the resistor R1 is secured onto the circuit element-mounting surface A of the circuit board 2 at a position close to the short side 21 of the circuit board 2 maintaining a distance L1 from the short side 21 and, similarly, the resistor R2 is secured onto the back surface B of the circuit board 2 close to the short side 21 of the circuit board 2 maintaining a distance L1 from the short side 21.

Figure 25:
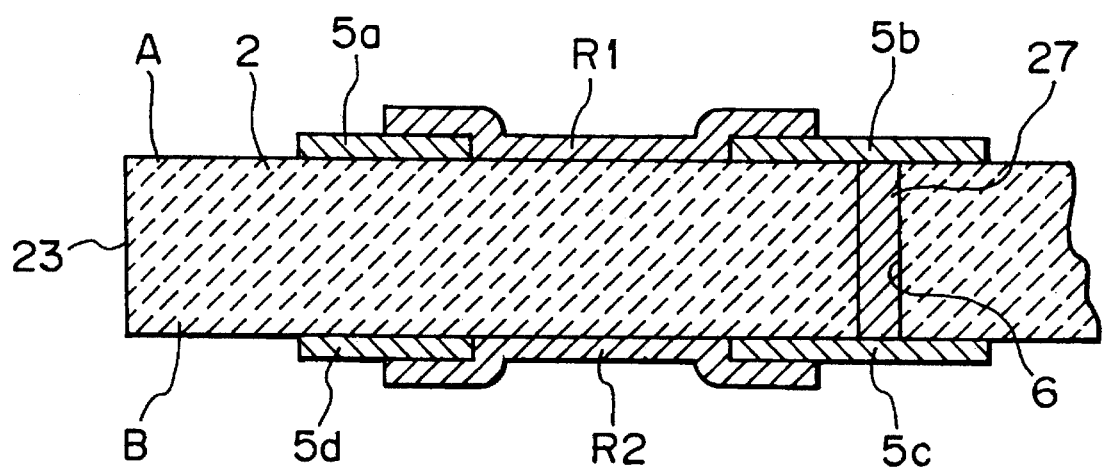
FIG. 25 is a sectional view illustrating on an enlarged scale a resistor used for the electronic circuit device according to the second aspect of the present invention.

The resistors R1 and R2 are made of an oblong film measuring 1.5 mm×0.85 mm×10 μm in length, width and thickness, and have a lengthwise direction which is in parallel with the short side 21. As shown in FIG. 25, the resistors R1 and R2 are thick-film resistors composed of a resistive paste formed by the screen printing technology followed by baking, and have at their both ends the wiring layers 5a to 5d of a thickness of about 10 μm composed of Ag, Ag/Pdm Cu or the like.

The circuit board 2 has a through hole 6 formed therein. A conductor 27 is buried in the through hole 6 to connect the wiring layer 5b and the wiring layer 5c together, whereby the resistors R1 and R2 are connected in series to constitute a composite resistor R.

The molded resin portion 3 is formed by inserting the circuit board 2 in the case 1, and then pouring the epoxy resin into the case 1 followed by thermosetting and cooling. The epoxy resin has a coefficient of linear expansion of about $51\times10^{-6}/°C$. and a coefficient of volume contraction of about 96% after being cured from the liquid state.

The above-mentioned circuit on the circuit board 2 has a first-stage amplifier consisting of a monolithic operational amplifier OP and resistors R1 and R2, the voltage amplification factor k of the operational amplifier circuit being proportional to the resistance of the composite resistor R.

The above-mentioned hybrid IC warps toward the side of the circuit element-mounting surface A as schematically shown in FIG. 6 due to the curing and contraction of the sealing resin portion 3.

As the circuit board 2 warps on account of the reasons mentioned above (i.e., due to bending stress in the direction perpendicular to the surface of the circuit board 2), compressive stress is exerted on the resistor R1 secured on the circuit board 2 and tensile stress is exerted on the resistor R2.

Even in this example, the experimental results obtained are the same as those of the aforementioned first aspect illustrated in FIGS. 6 to 10. That is, to obtain the above-mentioned results in this embodiment 10, the resistors R1 and R2 have the same resistance and are secured to the front surface and back surface of the circuit board 2 at positions an equal distance from the short side 21 in the lengthwise direction of the circuit board 2. As a result, the compressive stress and the tensile stress acting upon the resistors R1 and R2 through the circuit board 2 become equal to each other, and resistances of the resistors R1 and R2 change by an equal amount, the directions of increase and decrease being opposite to each other.

Figure 26:
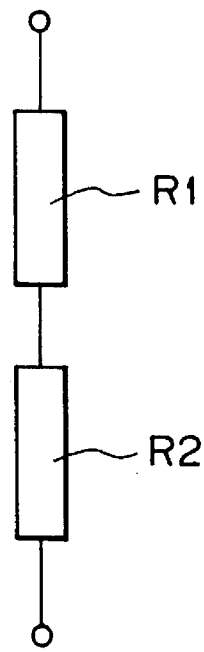
FIGS. 26 and 27 are diagrams explaining a concrete example of connecting the resistors according to the second aspect of the present invention.

Therefore, when the resistors R1 and R2 having a resistance r when no stress is exerted are connected in series as shown in FIG. 26, the resistance of the composite resistor R becomes r+r+Δr−Δr=2r provided changes in the resistances due to stress are Δr and −Δr. Thus, changes in the resistances caused by stress can be cancelled.

In this embodiment in which the resistors R1 and R2 are arranged close to the short side 21, furthermore, reduced stress acts upon the resistors R1 and R2 in proportion to the bending stress of the circuit board 2 and dispersion of stress can be reduced. As a result, the circuit board 2 that is warped only slightly affects the output characteristics (voltage amplification factor k) of the operational voltage amplifier circuit.

In this embodiment 10, furthermore, the resistors R1 and R2 are arranged in the lengthwise direction thereof in parallel with the short side 21. Then, the compressive stress acting upon the resistors R1 and R2 disperses slightly, and the resistances of the two resistors R1 and R2 also disperse slightly.

Figure 27:
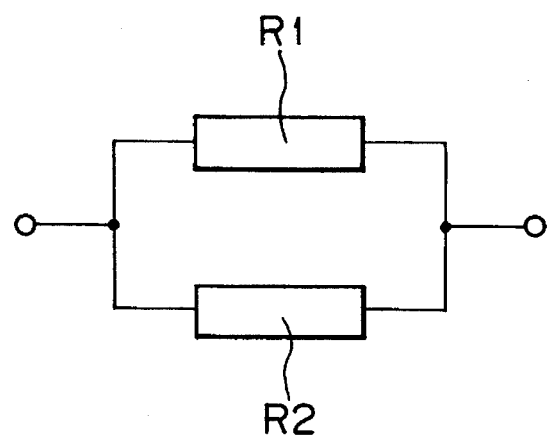

Even in this embodiment as described earlier, the lengthwise directions of the resistors R1 and R2 can be set to be in parallel with the long sides 23, 24 of the circuit board 2, or the lengthwise directions of the resistors R1 and R2 may be tilted by a predetermined angle relative to the lengthwise direction of the circuit board 2. Furthermore, there may be formed two through holes as shown in FIG. 27 in order to connect the resistors R1 and R2 in parallel. It is further allowable to coat the surfaces of the resistors R1 and R2 on both sides with a film such as of Silicon-Gel to buffer the stress. In the aforementioned embodiment, the resistors R1 and R2 possessed equal initial resistance. The resistors R1 and R2, however, may have different initial resistances. That is, when they have equal resistance, changes in the resistances can be brought to almost zero since they are positioned at an equal distance from the short side 21. Even when there is a difference to some extent between the initial resistances, a change in the resistance of the composite resistor R can be decreased. In the above-mentioned embodiment, furthermore, the resistors R1 and R2 are positioned at an equal distance from the short side 21. A change in the resistance R, however, can be decreased even when the resistors are positioned at different distances from the short side 21.

[Embodiment 11]

Figure 20:
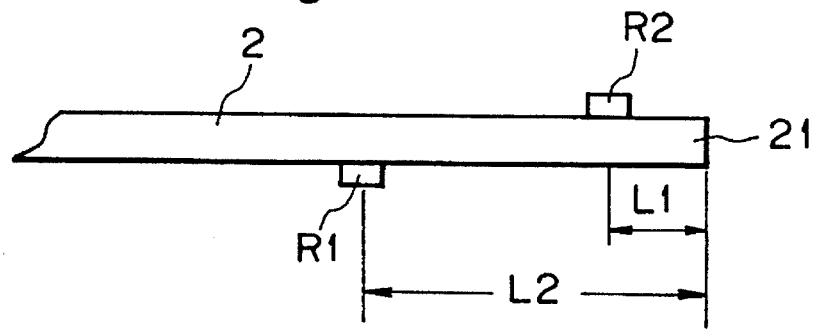
FIG. 20 is a sectional view for explaining the constitution of a first example according to a second aspect of the present invention.

A further example according to the second aspect of the present invention will now be described as embodiment 11. According to the constitution of this example as shown in FIG. 20, the two resistors R1 and R2 are arranged on different surfaces of the circuit board in contrast with the constitution of the embodiment 7 of the first aspect. That is, the resistor R1 is secured onto the front surface of the circuit board 2 and the resistor R2 is secured onto the back surface of the circuit board 2. The output (output voltage, output current or output frequency) of the circuit which uses the resistors R1 and R2 is an arbitrary functional value with (r1+a×r2) as a variable where r1 denotes the resistance of the resistor R1 and r2 the resistance of the resistor R2. Here, a is a constant which is equal to a resistance increment Δr1 of the resistor R1/a reduction of resistance of the resistor R2. Then, the variable (r1+a×r2) becomes (r1+Δr1+a×r2−a×Δr2). Since Δr1−a×Δr2=0, changes in the resistances of the resistors R1 and R2 are cancelled.

In this embodiment, furthermore, the resistor R2 is secured at a position of a distance L1 from the short side 21 and the resistor R1 is secured at a position of a distance L2 from the short side 21. The amount of change in the resistance caused by stress acting on the resistor is a function (F(L$_1$), F(L$_2$)) of the distance from the end of the board. Therefore, a change in the resultant resistance of the two resistors can be brought to 0 if the resistors are arranged (secured) by taking into consideration the amount of changes in the resistances (varies depending on the material, shape, etc.) of the resistors that are used.

Though the above embodiment has dealt with cancelling changes in the resistances of the pair of resistors R1 and R2, it should be noted that the composite resistor R may be constituted by three or more resistors, as a matter of course.

[Embodiment 12]

Figure 28:
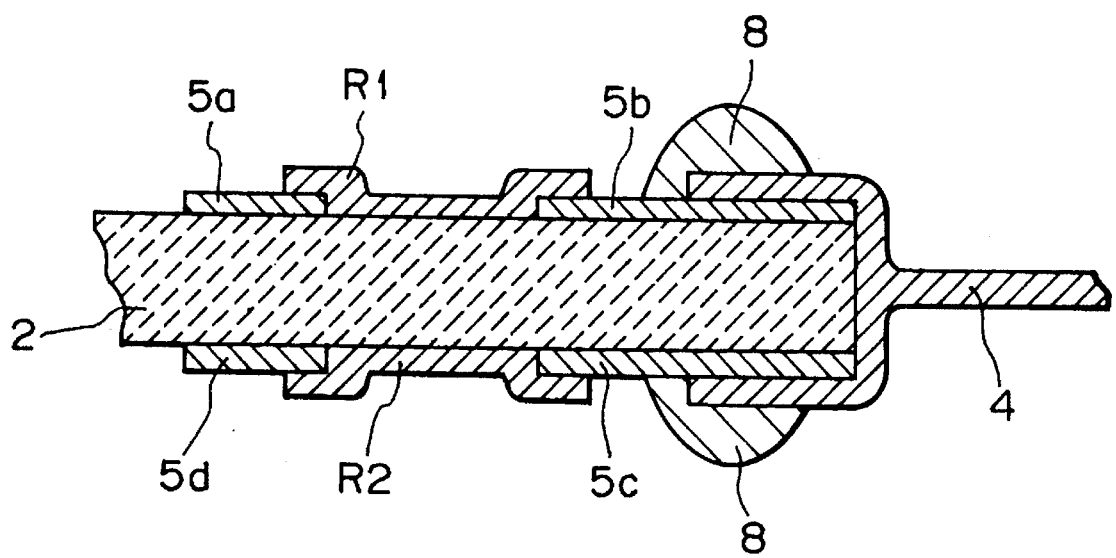
FIG. 28 is a sectional view illustrating the constitution of another example according to the second aspect of the present invention.

FIG. 28 illustrates a third example according to the second aspect of the present invention. In this embodiment, the wiring layers 5b and 5c of the resistors R1 and R2 are short-circuited by a lead 4 instead of the through hole. Here, reference numeral 8 denotes solder.

This helps omit the through holes.

The present inventors have forwarded the study in an attempt to optimize the arrangement and shape of the resistors on the circuit board in order to compensate for changes in the resistances of the resistors on the circuit board that is subject to being deformed in the electric circuit device. In order to solve problems inherent in the prior art, the inventors felt it necessary to take into consideration the positional relationship between the circuit board 2 and the case 1 and properties of the resin that will be introduced in addition to arrangement of the resistors on the circuit board. Namely, the inventors have studied preferred aspects by taking into consideration the experimentally measured results of FIGS. 6 to 10. The results will now be described in the following embodiments.

[Embodiment 13]

Figure 29:
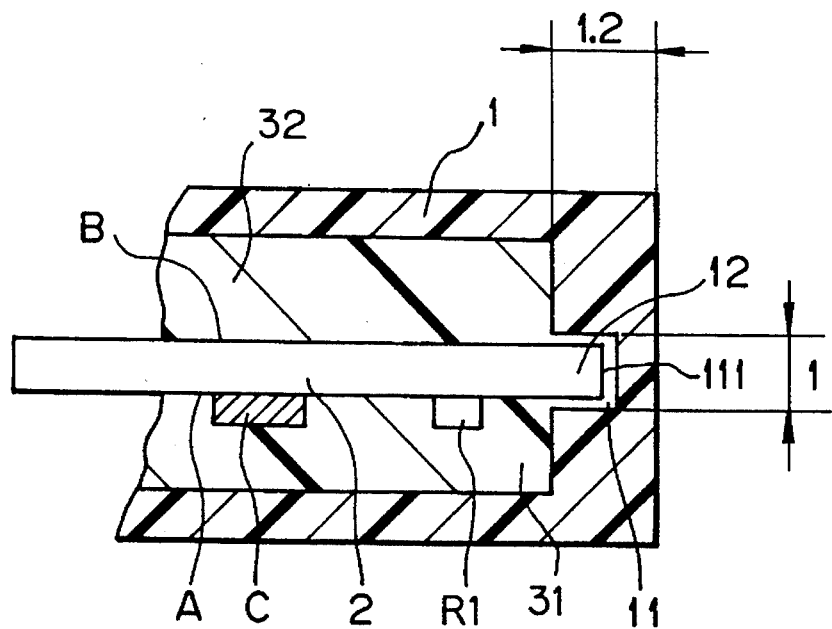
FIG. 29 is a sectional view illustrating the constitution of the electronic circuit device according to a third aspect of the present invention.

In this embodiment as a third aspect of the present invention, deformation such as warping of the circuit board is prevented in the case 9 by limiting the circuit board 2 to a particular position in the case. Concretely, as shown in FIGS. 1 and 29, an electronic circuit device comprises:

a case 1 of which the bottom surface is open;

a circuit board 2 having resistors R1, R2 formed thereon and a chip element c mounted on the front surface thereof, and being accommodated in the case 1;

a molded resin portion 3 which is filled in the case 1 to cover the whole surface of the circuit board 2;

leads 4 which are secured at the ends on one side to the circuit board 2 and are outwardly protruding at the ends on the other side penetrating through the molded resin portion 3; and a board guide member 11 having a board-fitting groove 111 which is arranged in the case 1 and holds the ends of the circuit board 2;

wherein the board-fitting groove 111 is formed in the board guide member 11 at a central position in the thickness direction of the case.

In this embodiment, the circuit board 2 is inserted in the case 1, the end 12 of the circuit board 2 is fitted in and held by the board-fitting groove 111 of the board guide member 11 and under this condition, the case is filled with the molding resin so that the whole surface of the circuit board is covered.

The circuit board 2 used in this embodiment may be the one that is used in the aforementioned first aspect.

In this embodiment as shown in FIG. 29, a guide recess 11 is formed at both inner ends in the lengthwise direction of the case 1. The guide recess 11 has a size of 1 mm×1.2 mm×11 mm in length, width and height. Between a pair of guide recesses 11 is formed a board-fitting groove 12 into which will be fitted the ends of the circuit board 2 that is shown in FIG. 1.

What is important in this embodiment is that the case 1 has main inner surfaces of the same and flat shape that face the main surfaces (part-mounting surface A and part non-mounting surface B) of the circuit board 2, and that the board-fitting groove 111 is formed in the case 1 at a central position in the thickness direction thereof. As a result, the circuit board 2 is held a space in the case 1 at the center in the thickness direction thereof.

That is, in this embodiment, the circuit board 2 that is fitted into the board-fitting groove 12 is secured a space in the case 1 at a central position in the thickness direction. As a result, the amount of the molded resin portion 31 on the side of the part-mounting surface A becomes nearly equal to the amount of the molded resin portion 32 on the side of the part non-mounting surface B. Accordingly, the compressive stress acting upon the surface A from the molded resin portion 31 becomes nearly equal to the compressive stress acting upon the surface B from the molded resin portion 32, whereby the circuit board 2 is prevented from being warped. Therefore, the resistor R1 is prevented from exhibiting changing resistance.

The amount of the molded resin portion 31 on the side of the part-mounting surface A is reduced by the amounts of chip C and resistor R1 secured to the part-mounting surface A and, hence, the circuit board 2 may be bent toward the direction in which the part non-mounting surface B becomes concave. In practice, however, the volumes of the resistor R1 and the like are very small. In addition, the circuit elements on the part-mounting surface A work to bend the circuit board 2 toward a direction in which the part-mounting surface A becomes concave by a force equal to the bending stress acting on the circuit elements. Therefore, the two forces cancel each other.

Compressive stress builds up in the circuit board as the molded resin portion 3 undergoes curing and contraction. The circuit board 2, however, is held at the center of the case in the direction of thickness thereof owing to the plate-fitting groove 11. Therefore, the molded resin portion 2 is filled in an amount greater than the conventional amount even on the side of the part non-mounting surface of the circuit board 2. As a result, the amount of the molded resin portion 3 on the side of the part-mounting surface becomes nearly equal to the amount of the molded resin portion on the side of the part non-mounting surface, and a nearly equal compressive stress acts upon both surfaces of the circuit board. Therefore, no bending stress builds up in the circuit board, the circuit board is not warped, and resistances of the resistors secured on the circuit board do not change.

It is thus made possible to greatly decrease the dispersion in the voltage amplification factor of the first-stage sense amplifier which is made up of the operational voltage amplifier circuit. Usually, the voltage amplification factor of the first-stage sense amplifier that amplifies a very small input signal voltage or a signal current must have a markedly improved stability compared with circuits of the subsequent stages that handle large signal voltages. According to this embodiment, dispersion in the voltage amplification factor is greatly decreased, making the circuit itself well suited to being used as a first-stage sense amplifier.

In the embodiment, furthermore, the groove portion 11 may be recessed in the case 1 as shown in FIG. 29 or may be formed by protrusions 113 as shown in FIG. 3.

In the aforementioned embodiment, a greater effect is obtained if the surfaces of the circuit board 2 are coated with Silicon-Gel prior to being accommodated in the case 1. In this case, the epoxy resin should be applied to both surfaces A and B of the circuit board 2 maintaining an equal thickness so that the amounts of the epoxy resin are the same on both surfaces A and B.

Next, the electronic circuit device according to a fourth embodiment of the invention will be described as embodiment 14.

The circuit board 2 used in the embodiments according to the fourth aspect described below may be the one that is used in the aforementioned first aspect.

[Embodiment 14]

According to embodiment 14, the circuit elements such as resistors and other electronic parts mounted on the circuit board are coated with a flexible resin and, then, an ordinary hard molding resin is filled in, in order to minimize changes in the resistances caused by deformation between the molded resin and the circuit board in the case.

That is, in this embodiment, the case 1 is filled with a soft resin 33 which covers the whole surface of the circuit board 2 under the condition in which the circuit board 2 is inserted in the case. Then, the opening 10 of the case is sealed with a closure portion 61 made of a hard resin. As shown in FIG. 3, furthermore, the board-fitting groove 111 formed inside the case 1 holds the ends of the circuit board.

Unlike the prior art, therefore, the case is not filled with the thermosetting and contracting sealing resin but is filled with the soft resin only which protects the circuit board. Therefore, no stress is exerted on the circuit board. Moreover, since the closure portion shields the opening at the bottom of the case, the soft resin and the circuit board are protected and the leads are secured, as well.

Accordingly, there is realized an electronic circuit device eliminating changes in the resistances of the resistors caused by stress.

Figure 30:
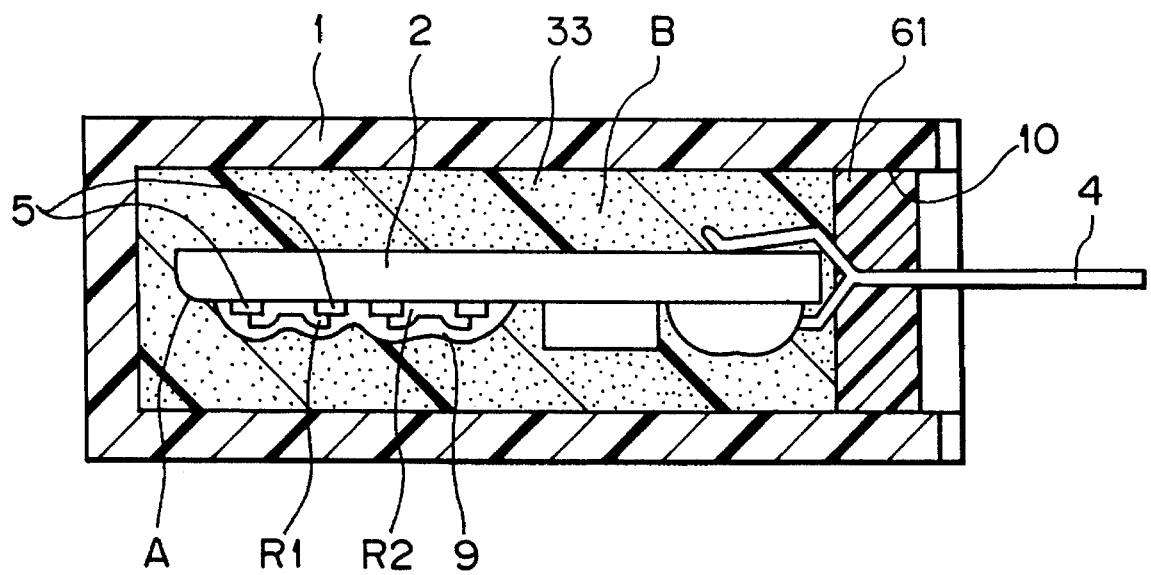
FIG. 30 is a sectional view illustrating the constitution of the electronic circuit device according to a fourth aspect of the present invention.

The embodiment will be described below in further detail. As shown in FIG. 30, the electronic circuit device is a hybrid IC which comprises the case 1 having an opening 10, the circuit board 2 accommodated in the case 1, a Silicon-Gel portion (soft resin portion) 33 filled in the case 1, the closure portion 61 which shields the opening 10 of the case 1, and the leads 4 which are secured at the ends on one side to the circuit board 2 in the case 1 and are outwardly protruding at the ends on the other side penetrating through the closure portion 61.

After the circuit board 2 is inserted in the case 1, the Silicon-Gel (trade name, DT087, produced by Toray Co.) is injected into the case 1 through a nozzle and is thermally set at 145° C. for 40 minutes. As shown in FIG. 30, the Silicon-Gel portion 33 is poured until the whole surface of the circuit board 2 is completely covered. The Silicon-Gel portion 33 is not poured into the upper portion (opening 10 in this invention) in space in the case 1 but, instead, the closure portion 61 is formed therein as will be described later.

After the Silicon-Gel portion 33 is cured, the cover portion 61 is formed by pouring a liquid-like epoxy resin (trade name, Eco-Gel, produced by Nippon Pernox Co.) which is then thermally set at 125° C. for two hours and is cooled. The epoxy resin has a coefficient of molding contraction of about 96% and a coefficient of linear expansion of about $51 \times 10^{-6}/°C$. Therefore, the leads 4 which are secured at their inner ends to the circuit board 2 are held at their central portions by the closure portion 61 and outwardly protrude at their outer ends.

According to this embodiment as described above, space in the case 1 is filled with the Silicon-Gel portion 33 except the opening 10 thereof. Unlike the prior art, therefore, the circuit board 1 is not warped by the molded resin portion composed of an epoxy resin that undergoes contraction, and resistances of the resistors R1 and R2 do not change.

In this embodiment, furthermore, the opening 10 of the case 1 is sealed by potting the liquid-like epoxy resin and, in addition, the leads 4 are secured. Therefore, the circuit board 1 is secured to the closure portion 61 via the leads 4. In this embodiment, the board-fitting groove 12 between the pair of guide protrusions 11 has a width greater than the thickness of the circuit board 1, so that the circuit board 1 is prevented from being displaced by the external force.

This makes it possible to eliminate dispersion in the voltage amplification factor of the first-stage sense amplifier made up of the operational voltage amplifier circuit that is caused by changes in the resistors. Usually, the voltage amplification factor of the first-stage sense amplifier that amplifies a very small input signal voltage or a signal current must have a markedly improved stability compared with circuits of the subsequent stages that handle large signal voltages. According to this embodiment, dispersion in the voltage amplification factor is greatly decreased, making the circuit itself well suited to being used as a first-stage sense amplifier.

[Embodiment 15]

Figure 31:
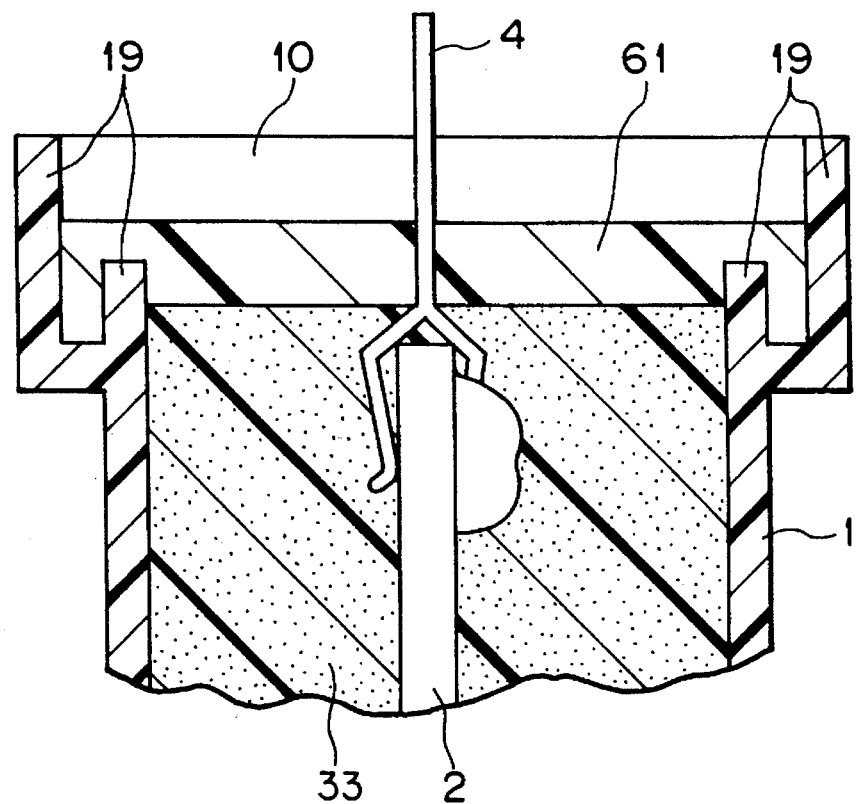
FIG. 31 is a sectional view illustrating another example of the constitution of the electronic circuit device according to the fourth aspect of the present invention.
Figure 32:
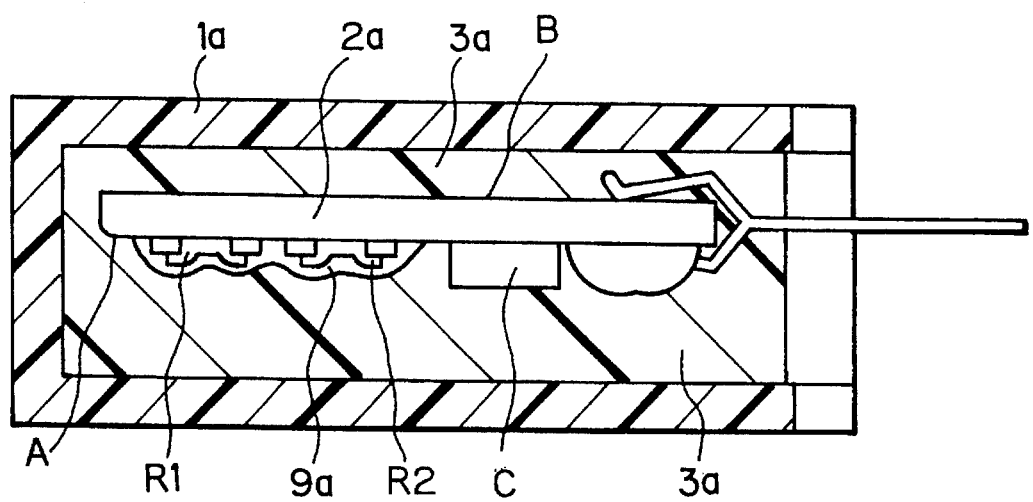
FIG. 32 is a sectional view illustrating an example of the constitution of a conventional electronic circuit device.
Figure 33:
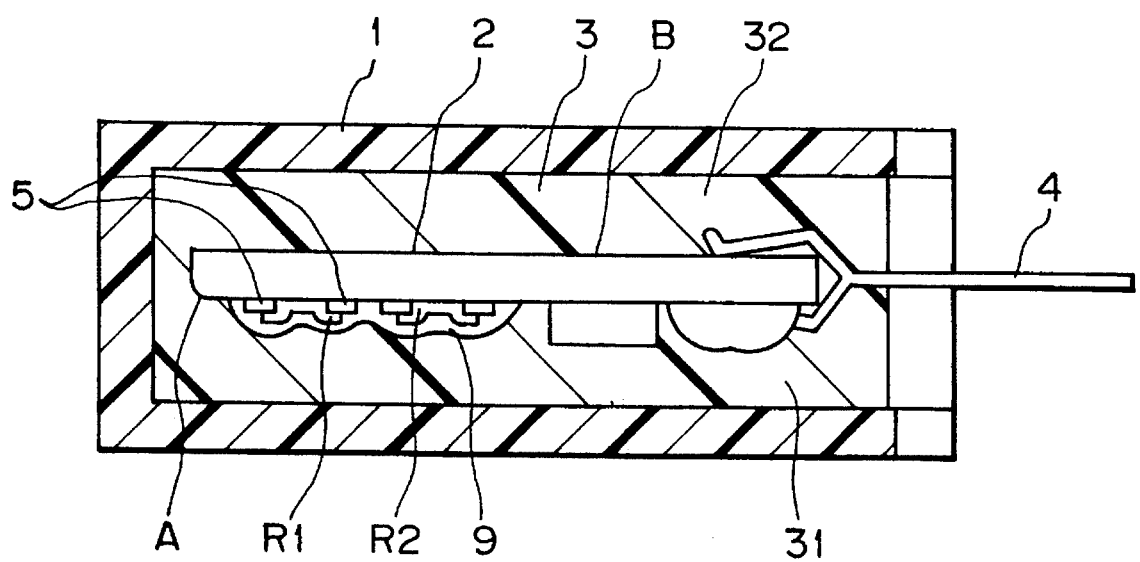
FIG. 33 is a sectional view illustrating the constitution of the electronic circuit device according to the third aspect of the present invention.

FIG. 31 illustrates another example according to the fourth aspect of the present invention.

In this embodiment, a double-wall portion 19 is provided to surround the opening 10 of the case 1, and the closure portion 61 is fitted to the groove in the double-wall portion 19. Therefore, the contact area increases between the closure portion 61 and the case 1; i.e., the two are engaged with each other contributing to reinforcing the junction and to improving a moisture-proof property in the interior.

In the foregoing were described first to fourth aspects of the invention for compensating changes in the resistances of the resistors in an electronic circuit device caused by deformation of the circuit board. According to the present invention, however, it is also allowable to combine the first and second aspects together, or to combine the first and second aspects together with the third aspect or the fourth aspect, or to combine all of the above-mentioned aspects together. These combinations exhibit effects superior to those obtained when each of the above-mentioned aspects is used alone.

We claim:

1. An electric circuit device comprising:

a circuit board having a rectangular configuration;

a circuit arranged on said circuit board and including
first and second resistors that are secured to said circuit board, wherein said first and said second resistors are separately secured to a front surface and a back surface of said circuit board, respectively,
said first and said second resistors being secured at an equal distance in said lengthwise direction of said circuit board from a short side;
a molded resin portion secured to said surfaces of said circuit board to cover said circuit; and leads that are secured at the ends on one side thereof to said circuit board and are outwardly protruding at the ends on the other side thereof penetrating through said molded resin portion, wherein said first and second resistors are arranged at positions where changes in the resistances of said resistors as a result of stress is cancelled in said output of said circuit, and wherein, when resistance values of said first and said second resistors are set at r1 and r2, respectively, an output of a circuit having said first and second resistors, has any functional value with (r1×r2) or (r1+r2) as a variable.

2. An electric circuit device comprising:

a circuit board having a rectangular configuration;

a circuit arranged on said circuit board and including first and second resistors that are secured to said circuit board, said resistors being secured at an equal distance in the lengthwise direction of said circuit board from a short side;

a molded resin portion secured to the surfaces of said circuit board to cover said circuit; and leads that are secured at the ends on one side thereof to said circuit board and are outwardly protruding at the ends on the other side thereof penetrating through said molded resin portion;

wherein said first and said second resistors are arranged at positions where changes in the resistances of said resistors as a result of stress is cancelled in said output of said circuit, and wherein said changes in resistance of said first and said second resistors vary in linear proportion to distances from said short side of said circuit board to positions on which both said first and second resistors are arranged, and further wherein, when resistance values of said first and said second resistors are set at r1 and r2, respectively, and distances from said short side of said circuit board to said first resistor and to said second resistor are set at L1 and L2, respectively, an output of a circuit having said first and second resistors, has any functional value with (r1−a×r2) as a variable, wherein a is a constant equal to a change in resistance of said first resistor divided by a change in resistance of said second resistor.

3. An electric circuit device comprising:

a circuit board having a rectangular configuration;

a circuit arranged on said circuit board and including first and second resistor groups each having one or more resistors that are secured to said circuit board, said resistors of said first and second resistor groups being secured at an equal distance in the lengthwise direction of said circuit board from a short side;

a molded resin portion secured to the surfaces of said circuit board to cover said circuit; and leads that are secured at the ends on one side thereof to said circuit board and are outwardly protruding at the ends on the other side thereof penetrating through said molded resin portion;

wherein said two resistor groups are arranged at positions where changes in the resistances of said two resistor groups as a result of stress is cancelled in the output of said circuit, and wherein said first resistor group includes first and second resistors and said second resistor group includes third and fourth resistors, and wherein an operational voltage amplifier circuit is formed by said first, second, third and fourth resistors, said first and second resistors being arranged at positions an equal distance from said short side in said lengthwise direction of said circuit board, and said third and fourth resistors being arranged at positions an equal distance from said short side in said lengthwise direction of said circuit board, and wherein when input voltages input to said operational voltage amplifier circuit are V1 and V2, and resistance value of said first to fourth resistors r1 to r4, respectively, an output voltage Vout of said circuit is set by an equation as follows:

Vout=(r1+r2)/(r3+R4)×r4/r1.V2−r2/r1.V1

4. An electric circuit device comprising:

a circuit board having a rectangular configuration;

a circuit arranged on said circuit board and including first and second resistors that are secured to said circuit board;

a molded resin portion secured to the surfaces of said circuit board to cover said circuit; and leads that are secured at the ends on one side thereof to said circuit board and are outwardly protruding at the ends on the other side thereof penetrating through said molded resin portion;

wherein provision is made of a composite resistor obtained by mutually connecting said first and second resistors, and wherein said first and second resistors are arranged at positions which result in cancellation of any changes in the resistance of said composite resistor caused by changes in the resistance of said first and second resistors as a result of residual stress and external stress, wherein said first and second resistors mounted on said circuit board are secured at an equal distance in the lengthwise direction of said circuit board from a short side, and wherein said changes in resistance of said first and said second resistors vary in linear proportion to distances from said short side of said circuit board to positions on which both said first and second resistors are arranged, and further wherein, when resistance values of said first and said second resistors are set at r1 and r2, respectively, and distances from said short side of said circuit board to said first resistor and to said second resistor are set at L1 and L2, respectively, the output of a circuit having said first and second resistors has any functional value with (r1+a×r2) as a variable, wherein a is a constant equal to a change in resistance of said first resistor group divided by a change in resistance of said second resistor.

5. An electric circuit device comprising:

a case having an opening and having a board-fitting groove in the inner surface thereof;

a circuit board disposed in said groove to which circuit elements inclusive of resistors are secured;

a soft resin portion filled in said case to cover the entire surfaces of said circuit board;

a closure portion composed of a hard resin to shield said opening of said case; and leads which are secured at the ends on one side to said circuit board and are outwardly protruding penetrating through said closure portion, wherein a double-wall portion is provided to surround said opening of said case and said closure portion made of hard resin is fitted to a groove formed by said double-wall portion.

6. An electric circuit device according to claim 4, wherein said circuit device is provided with a through hole in which a conducting material is buried and said first resistor, secured on a surface of said circuit board, is connected to said second resistor, secured on an opposite surface of said circuit board through said conducting material buried in said through hole.

7. An electric circuit device according to claim 4, wherein said circuit device is provided with a lead connecting a surface of said circuit board to an opposite surface of said circuit board and said first resistor secured on a surface of said circuit board is connected to second resistor secured on an opposite surface of said circuit board through said lead.

8. An electric circuit device according to claim 5, wherein said soft resin portion is made of silicone gel.

9. An electric circuit device according to claim 5, wherein said hard resin forming a closure portion of said circuit board is made of epoxy resin.

* * * * *